United States Patent
Lee et al.

(10) Patent No.: US 12,440,861 B2
(45) Date of Patent: Oct. 14, 2025

(54) CHEMICAL LIQUID SUPPLY UNIT, SUBSTRATE PROCESSING APPARATUS HAVING THE SAME, AND CHEMICAL LIQUID SUPPLY METHOD

(71) Applicant: SEMES CO., LTD., Cheonan-si (KR)

(72) Inventors: Joo Sung Lee, Cheonan-si (KR); Kang Suk Lee, Yongin-si (KR); Soon Kab Kwon, Gimhae-si (KR)

(73) Assignee: SEMES CO., LTD., Cheonan-si (KR)

( * ) Notice: Subject to any disclaimer, the term of this patent is extended or adjusted under 35 U.S.C. 154(b) by 146 days.

(21) Appl. No.: 17/992,930

(22) Filed: Nov. 23, 2022

(65) Prior Publication Data

US 2023/0158533 A1    May 25, 2023

(30) Foreign Application Priority Data

Nov. 24, 2021   (KR) .................. 10-2021-0163663

(51) Int. Cl.
| | | |
|---|---|---|
| H01L 21/67 | (2006.01) | |
| B05B 7/04 | (2006.01) | |
| B05B 7/24 | (2006.01) | |
| B05B 12/00 | (2018.01) | |
| B05B 12/14 | (2006.01) | |
| B05B 14/00 | (2018.01) | |

(52) U.S. Cl.
CPC ............ *B05B 14/00* (2018.02); *B05B 7/0408* (2013.01); *B05B 7/2486* (2013.01); *B05B 12/00* (2013.01); *B05B 12/1418* (2013.01); *H01L 21/67023* (2013.01); *H01L 21/6715* (2013.01)

(58) Field of Classification Search
None
See application file for complete search history.

(56) References Cited

U.S. PATENT DOCUMENTS

| | | | |
|---|---|---|---|
| 7,249,995 B2 | 7/2007 | Tanoue et al. | |
| 2009/0159105 A1* | 6/2009 | Keigo | H01L 21/67253 134/57 R |
| 2014/0144529 A1* | 5/2014 | Schwaiger | H01L 21/67051 137/551 |
| 2015/0060406 A1* | 3/2015 | Negoro | H01L 21/67051 118/706 |
| 2018/0277398 A1* | 9/2018 | Osada | H01L 21/67051 |
| 2018/0299908 A1* | 10/2018 | Amikura | H01L 21/67017 |

FOREIGN PATENT DOCUMENTS

| | | | | |
|---|---|---|---|---|
| JP | S6091419 A | * | 5/1985 | ............... G05D 7/00 |
| JP | 2011-124343 | | 6/2011 | |
| KR | 10-2006-0030073 | | 4/2006 | |

OTHER PUBLICATIONS

Office Action from the Korean Intellectual Property Office dated Jul. 27, 2023.

* cited by examiner

*Primary Examiner* — Binu Thomas

(57) ABSTRACT

Proposed are a chemical liquid supply unit, a substrate processing apparatus having the same, and a chemical liquid supply method. More particularly, proposed is a technique for supplying chemical liquids of different flow rates, in which a chemical liquid is supplied at the same flow rate to each of a plurality of chemical liquid lines and the flow rate of the chemical liquid is adjusted through a flow control valve disposed on at least one chemical liquid line selected among the plurality of chemical liquid lines, so that the plurality of chemical liquid lines can supply chemical liquids at different flow rates.

11 Claims, 19 Drawing Sheets

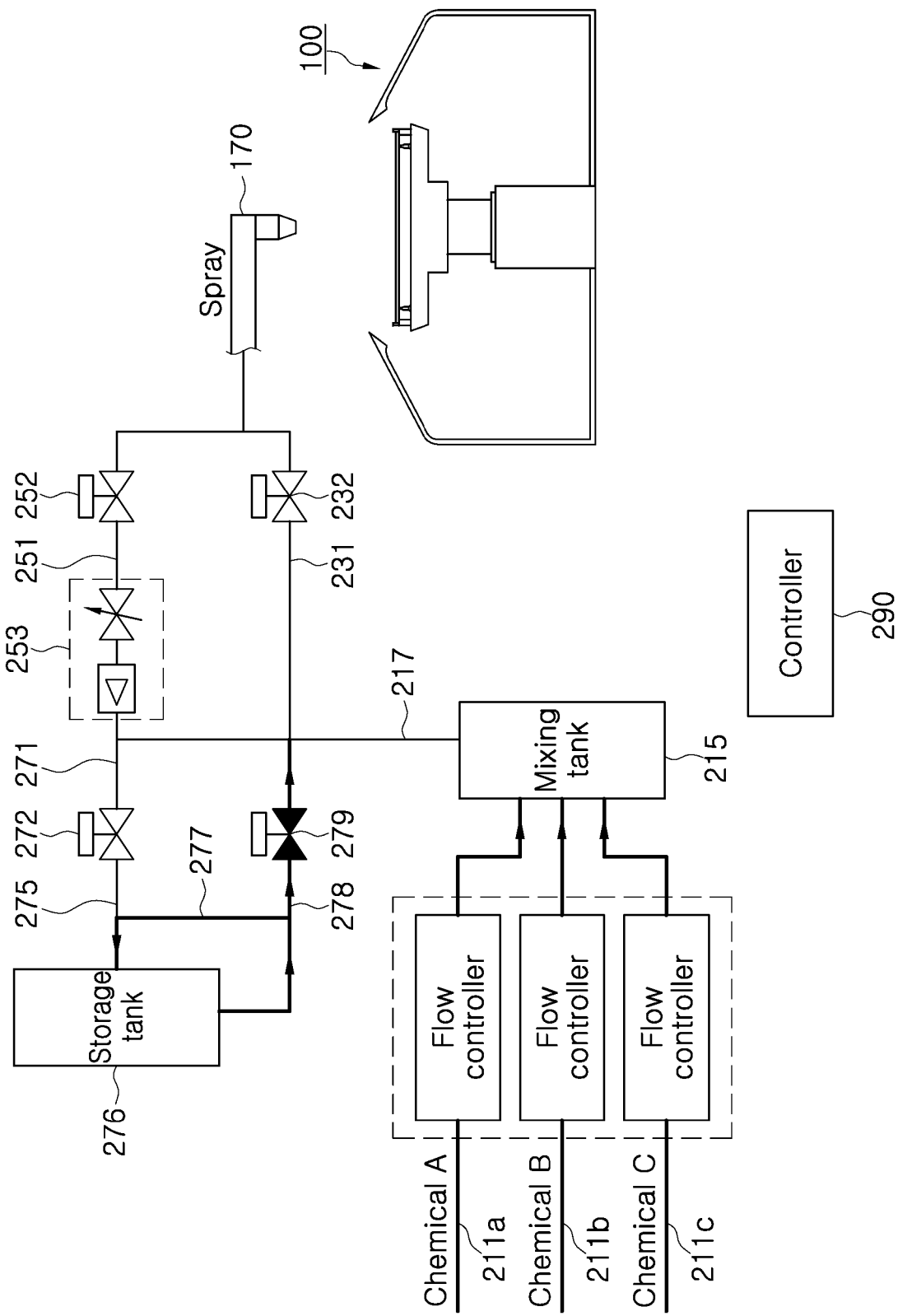

CHEMICAL LIQUID SUPPLY UNIT, SUBSTRATE PROCESSING APPARATUS HAVING THE SAME, AND CHEMICAL LIQUID SUPPLY METHOD

CROSS REFERENCE TO RELATED APPLICATION

The present application claims priority to Korean Patent Application No. 10-2021-0163663, filed Nov. 24, 2021, the entire contents of which is incorporated herein for all purposes by this reference.

BACKGROUND OF THE INVENTION

Field of the Invention

The present disclosure relates generally to a chemical liquid supply unit, a substrate processing apparatus having the same, and a chemical liquid supply method. More particularly, the present disclosure relates to a technique for supplying chemical liquids of different flow rates, in which a chemical liquid is supplied at the same flow rate to each of a plurality of chemical liquid lines and the flow rate of the chemical liquid is adjusted through a flow control valve disposed on at least one chemical liquid line selected among the plurality of chemical liquid lines, so that the plurality of chemical liquid lines can supply chemical liquids at different flow rates.

Description of the Related Art

In a semiconductor manufacturing process, a process of processing a substrate using a plurality of chemical liquids is performed.

Depending on the type of substrate processing, a process of processing the substrate by supplying a single chemical liquid may be performed, or a process of processing the substrate by supplying a mixed chemical liquid obtained by mixing different chemical liquids in a predetermined mixing ratio may be performed. In processing the substrate by supplying these various chemical liquids, a certain process may require a high flow rate chemical liquid, and another certain process may require a low flow rate chemical liquid.

FIG. 1 is a view illustrating an example of a chemical liquid supply unit according to the related art.

As an example, in order to make a mixed chemical liquid in which three chemical liquids A, B, and C are mixed in different mixing ratios, flow controllers 30 and 40 for providing each of the chemical liquids B, and C at an adjusted flow rate are disposed, and mixing tanks 31 and 41 for mixing and supplying the chemical liquids A, B, and C are disposed.

There is a need to supply chemical liquids of different flow rates through a nozzle 15 of a substrate processing apparatus 10 depending on the type of substrate processing. To meet this, for example, in order to supply a high flow rate chemical liquid, the flow controller 30 for providing each of chemical liquids A, B, and C at an adjusted flow rate corresponding to the high flow rate chemical liquid and the mixing tank 31 for mixing the chemical liquids A, B, and C are disposed, and a valve 35 is disposed to supply the high flow rate chemical liquid to the nozzle 15 of the substrate processing apparatus 10.

On the other hand, in order to supply a low flow rate chemical liquid, the flow controller 40 for providing each of the chemical liquids A, B, and C at an adjusted flow rate corresponding to the low flow rate chemical liquid and the mixing tank 41 for mixing the chemical liquids A, B, and C are disposed separately from the configuration for supplying the high flow rate chemical liquid, and a valve 45 is disposed to supply the low flow rate chemical liquid to the nozzle 15 of the substrate processing apparatus 1.

In order to supply the chemical liquids of different flow rates as described above, the chemical liquid supply unit has to be individually disposed for each required flow rate.

In particular, when it is necessary to supply chemical liquids having a plurality of different flow rates, each chemical liquid supply unit is individually disposed to correspond to the number of different flow rates to be supplied. This causes an exponential increase in the number of parts, including the flow controller for controlling the flow rate of each chemical liquid, a chemical liquid supply line for each flow rate, a supply control valve, and the like.

The foregoing is intended merely to aid in the understanding of the background of the present disclosure, and is not intended to mean that the present disclosure falls within the purview of the related art that is already known to those skilled in the art.

SUMMARY OF THE PRESENT DISCLOSURE

Accordingly, the present disclosure has been made keeping in mind the above problems occurring in the related art, and an objective of the present disclosure is to provide a method of supplying chemical liquids of different flow rates through one chemical liquid supply unit according to a substrate processing process situation.

In particular, when it is necessary to supply chemical liquids having a plurality of different flow rates according to different substrate processing process situations, each chemical liquid supply unit is individually disposed to correspond to the number of different flow rates to be supplied. This causes an exponential increase in the number of parts, including a flow controller for controlling the flow rate of each chemical liquid, a chemical liquid supply line for each flow rate, a supply control valve, and the like. Accordingly, another objective of the present disclosure is to solve this problem.

The objectives of the present disclosure are not limited to those mentioned above, and other objectives not mentioned and advantages of the present disclosure will be clearly understood from the following description.

According to one aspect of the present disclosure, there is provided a chemical liquid supply unit including: a chemical liquid supply means configured to supply a chemical liquid; a first flow rate chemical liquid supply means configured to receive the chemical liquid from the chemical liquid supply means and supply a chemical liquid of a first flow rate to a nozzle unit of a substrate processing apparatus; a second flow rate chemical liquid supply means configured to receive the chemical liquid at the same flow rate from the chemical liquid supply means and adjust the flow rate of the chemical liquid to supply a chemical liquid of a second flow rate to the nozzle unit of the substrate processing apparatus; and a controller configured to selectively control chemical liquid supply of the first flow rate chemical liquid supply means and the second flow rate chemical liquid supply means, and control flow rate adjustment so that the chemical liquid of the second flow rate is supplied at a different flow rate from the chemical liquid of the first flow rate.

According to an aspect of the present disclosure, there is provided a substrate processing apparatus including: the chemical liquid supply unit; a nozzle unit configured to receive chemical liquids of different flow rates from the chemical liquid supply unit and discharge the chemical liquids to a substrate in response to a substrate processing process; and a substrate support unit on which the substrate to be processed is seated.

According to an aspect of the present disclosure, there is provided a method of supplying a chemical liquid, the method including: a same flow rate chemical liquid supply step of supplying a chemical liquid of a first flow rate to each of a first chemical liquid line and a second chemical liquid line branched from a chemical liquid supply line; a required flow rate determination step of determining a required chemical liquid flow rate; and a discharged chemical liquid supply step of selectively supplying the chemical liquid of the first flow rate of the first chemical liquid line or a chemical liquid of a second flow rate of which a flow rate is adjusted through the second chemical liquid line to a nozzle unit of a substrate processing apparatus according to the required chemical liquid flow rate.

According to an aspect of the present disclosure, there is provided a chemical liquid supply unit including: a chemical liquid supply means configured to supply a chemical liquid; a chemical liquid supply line configured to receive the chemical liquid from the chemical liquid supply means and provide the chemical liquid through a plurality of branched lines; a first chemical liquid line connected to one of the branch lines of the chemical liquid supply line and configured to supply a chemical liquid of a first flow rate to a nozzle unit of the substrate processing apparatus; a first chemical liquid line valve disposed on the first chemical liquid line and configured to selectively supply the chemical liquid of the first flow rate of the first chemical liquid line according to opening and closing operations; a second chemical liquid line connected to another one of the branch lines of the chemical liquid supply line and configured to supply a chemical liquid of a second flow rate to the nozzle unit of the substrate processing apparatus; a flow control valve disposed on the second chemical liquid line and configured to adjust the first flow rate of the chemical liquid supplied to the second chemical liquid line to a second flow rate relatively smaller than the first flow rate; a second chemical liquid line valve disposed on the second chemical liquid line and configured to selectively supply the chemical liquid of the second flow rate of the second chemical liquid line according to opening and closing operations; a recovery line configured to recovery an excess chemical liquid except for the chemical liquid of the second flow rate from the chemical liquid of the first flow rate supplied to the second chemical liquid line according to flow rate adjustment of the flow control valve; and a controller configured to control the flow control valve to adjust a flow rate of the second chemical liquid line to the second flow rate relatively smaller than the first flow rate, and control the first chemical liquid line valve and the second chemical liquid line valve to supply chemical liquids of different flow rates to the nozzle unit of the substrate processing apparatus.

According to the present disclosure, it is possible to supply chemical liquids of different flow rates through one chemical liquid supply unit according to a substrate processing process situation.

In particular, a chemical liquid is supplied at the same flow rate to each of the plurality of chemical liquid lines and the flow rate of the chemical liquid is adjusted through the flow control valve disposed on at least one chemical liquid line selected among the plurality of chemical liquid lines, so that the plurality of chemical liquid lines can supply chemical liquids at different flow rates.

The effects of the present disclosure are not limited to those mentioned above, and other effects not mentioned will be clearly understood by those of ordinary skill in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 18 to 20 are views illustrating the third embodiment of processing the excess chemical liquid in the substrate processing apparatus according to the present disclosure.

DETAILED DESCRIPTION OF THE INVENTION

Hereinafter, exemplary embodiments of the present disclosure will be described in detail with reference to the accompanying drawings, but the present disclosure is not limited by these embodiments.

The present disclosure, operational advantages of the present disclosure, and objectives achieved by executing the present disclosure will be, hereinafter, described by exemplifying embodiments of the present disclosure and referring to the exemplified embodiments.

First, terms used herein is for the purpose of describing particular embodiments only and is not intended to be limiting. As used herein, the singular forms "a," "an", and "the" are intended to include the plural forms as well, unless the context clearly indicates otherwise. Further, it will be understood that the terms "comprise", "include", and/or "have" when used herein, specify the presence of stated features, integers, steps, operations, elements, and/or components, but do not preclude the presence or addition of one or more other features, integers, steps, operations, elements, components, and/or groups thereof.

Meanwhile, in the following description, a detailed description of related known configurations or functions may be omitted to avoid obscuring the subject matter of the present disclosure.

The present disclosure provides a technique for supplying chemical liquids of different flow rates, in which a chemical liquid is supplied at the same flow rate to each of a plurality of chemical liquid lines and the flow rate of the chemical liquid is adjusted through a flow control valve disposed on at least one chemical liquid line selected among the plurality of chemical liquid lines, so that the plurality of chemical liquid lines can supply chemical liquids at different flow rates.

Figure 1:
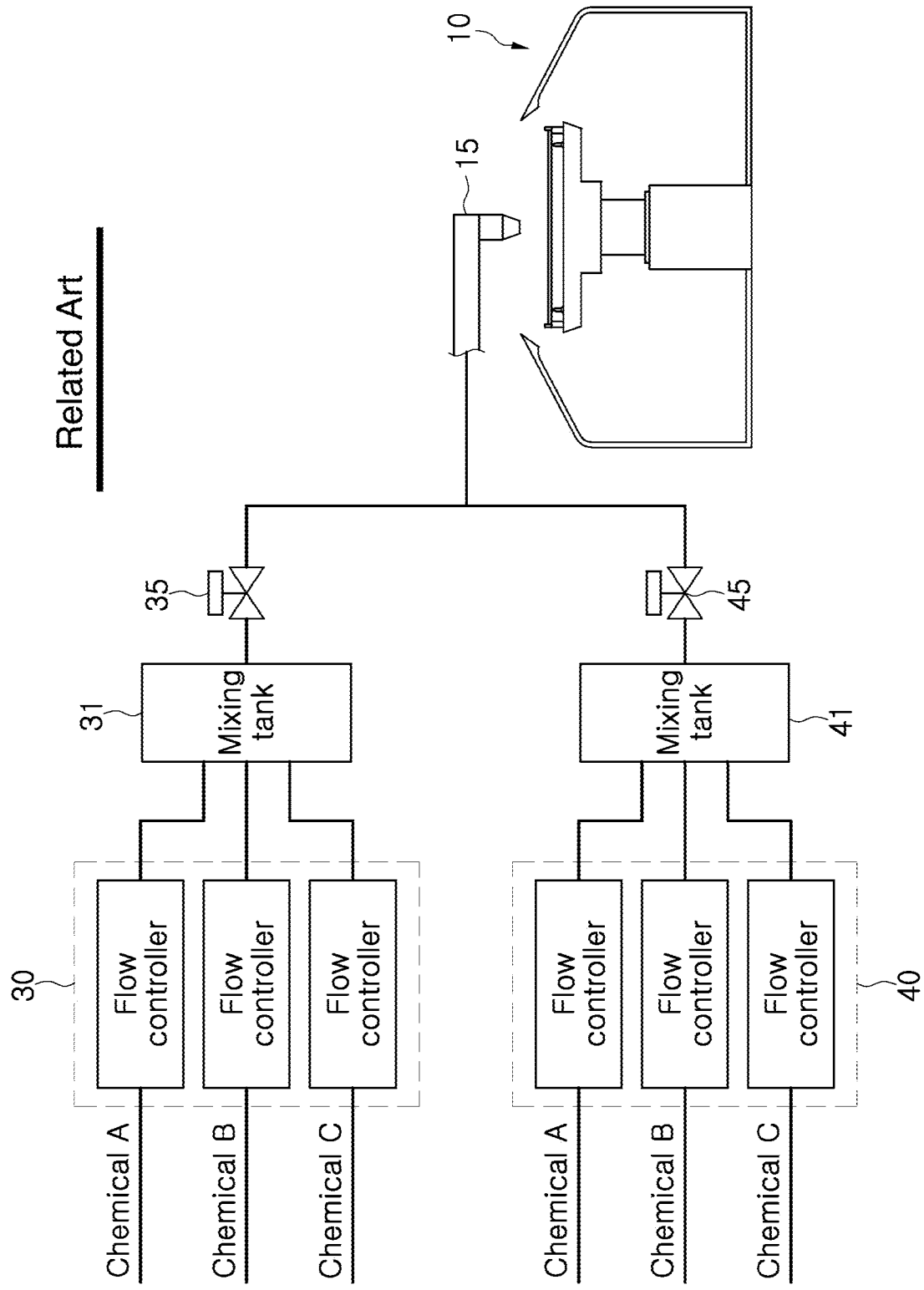
FIG. 1 is a view illustrating an example of a chemical liquid supply unit according to the related art.
Figure 2:
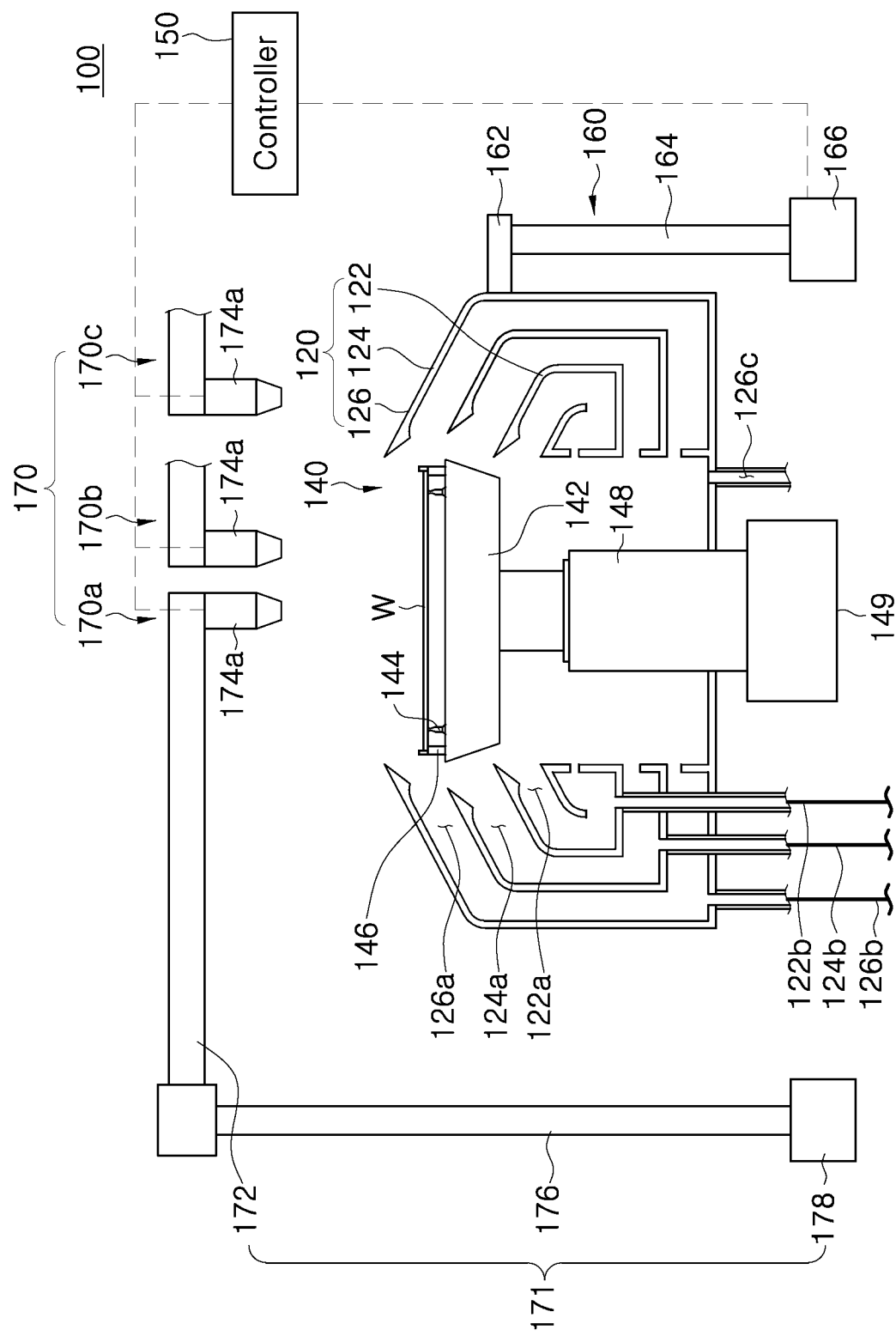
FIG. 2 is a view illustrating an example of a substrate processing apparatus to which the present disclosure is applied.

FIG. 2 is a view illustrating an example of a substrate processing apparatus to which the present disclosure is applied.

The substrate processing apparatus 100 may include a processing container 120, a substrate support unit 140, a lifting unit 160, a nozzle unit 170, and the like.

The processing container 120 may have a processing space therein, and may have a cylindrical shape with an open top. The processing container 120 may include a first recovery tub 122, a second recovery tub 124, and a third recovery tub 126. Each of the recovery tubs 122, 124, and 126 may recovers each type of processing liquid used in a process. The first recovery tub 122 may be provided in an annular ring shape surrounding the substrate support unit 140, the second recovery tub 124 may be provided in an annular ring shape surrounding the first recovery tub 122, and the third recovery tub 126 may be provided in an annular ring shape surrounding the second recovery tub 124. An inner space of the first recovery tub 122 may function as a first inlet 122a through which a liquid flows. A space between the second recovery tub 124 and the first recovery tub 122 may function as a second inlet 124a through which a liquid flows into the second recovery tub 124. A space between the second recovery tub 124 and the third recovery tub 126 may function as a third inlet 126a through which a liquid flows into the third recovery tub 126. According to an example, each of the inlets 122a, 124a, and 126a may be located at different heights. Recovery pipes 122b, 124b, and 126b may be connected to the bottom of the recovery tubs 122, 124, and 126, respectively.

The substrate support unit 140 may support a substrate W. The substrate support unit 140 may rotate the substrate W during the process. The substrate support unit 140 may include a body 142, a support pin 144, a chuck pin 146, and a support shaft 148. The body 142 may have an upper surface and a lower surface that are provided in a circular shape. The upper and lower surfaces of the body 142 may be located so that the central axes coincide with each other. The support shaft 148 rotatable by a driving unit 149 may be fixedly coupled to the lower surface of the body 142.

A plurality of support pins 144 may be provided. The support pins 144 may be arranged to be spaced apart from each other at a predetermined interval on an outer peripheral portion of the upper surface of the body 142 and may be formed to protrude upward from the body 142. The support pins 144 may be arranged to form a substantially annular ring shape by combination with each other. The support pins 144 may support an outer peripheral portion of a rear surface of the substrate W so that the substrate W is spaced apart a predetermined distance from the upper surface of the body 142.

A plurality of chuck pins 146 may be provided. The chuck pins 146 may be arranged farther from the center of the body 142 than the support pins 144. The chuck pins 146 may be provided to protrude upward from the body 142. The chuck pins 146 may support lateral side portions of the substrate W so as to prevent the substrate W from being laterally deviated from the original position thereof when the substrate W is rotated. The chuck pins 146 may be provided to be movable linearly between a standby position and a supporting position along a radial direction of the body 142. The standby position may be a position farther from the center of the body 142 than the supporting position. When the substrate W is loaded on or unloaded from the substrate support unit 140, the chuck pins 146 may be positioned at the standby position, and when the process is performed on the substrate W, the chuck pins 146 may be positioned at the supporting position. In the supporting position, the chuck pins 146 may be in contact with the lateral side portions of the substrate W.

The lifting unit 160 may adjust a relative height between the processing container 120 and the substrate support unit 140. The lifting unit 160 may linearly move the processing container 120 upward and downward. As the processing container 120 may be moved upward and downward, the relative height of the processing container 120 with respect to the substrate support unit 140 may be changed. The lifting unit 160 may include a bracket 162, a moving shaft 164, an actuator 166, and the like. The bracket 162 may be fixedly installed on an outer wall of the processing container 120, and the moving shaft 164 moved upward and downward by the actuator 166 may be fixedly coupled to the bracket 162. The processing container 120 may be moved downward so that the substrate support unit 140 protrudes above the processing container 120 when the substrate W is loaded on or unloaded from the substrate support unit 140. Furthermore, when the process is performed, the height of the processing container 120 may be adjusted so that a processing liquid is introduced into a predetermined one of the recovery tubs 122, 124, and 126 according to the type of the processing liquid supplied to the substrate W. Optionally, the height of the processing container 120 may be fixed, and the body 142 of the substrate support unit 140 may be moved upward and downward.

The nozzle unit 170 may supply various chemical liquids on the substrate W. The nozzle unit 170 may include a first nozzle member 170a (i.e., a first nozzle), a second nozzle member 170b (i.e., a second nozzle), a rinse nozzle member 170c (i.e., a rinse nozzle), and the like. The number of the nozzle members may be changed as needed.

The first nozzle member 170a may supply a first liquid, the second nozzle member 170b may supply a second liquid, and the rinse nozzle member 170c may supply a rinse liquid. According to an example, the first liquid may be a strong acid chemical including sulfuric acid ($H_2SO_4$) The second liquid may be an alkaline liquid including an organic solvent. The organic solvent may be isopropyl alcohol (IPA). The rinse liquid may be pure water ($H_2O$).

The first nozzle member 170a may include a first nozzle moving member 171 and a first nozzle 174a. The first nozzle moving member 171 may move the first nozzle 174a to a process position and a standby position. Here, the process position may be a position where the first nozzle 174a faces the substrate W supported by the substrate support unit 140, and the standby position may be a position where the first nozzle 174a is deviated from the process position. According to an example, the standby position may be a position where the first nozzle 174a is standby in a first standby port. The first nozzle moving member 171 may include a rotation shaft 176, an actuator 178, and a support arm 172. The rotation shaft 176 may be located at a side of the processing container 120. The rotation shaft 176 may be rotated by the actuator 178. The rotation shaft 176 may be rotated about the central axis thereof by a driving force provided from the actuator 178. The support arm 172 may connect the first nozzle 174a and the rotation shaft 176 to each other. As the rotation shaft 176 may be rotated, the support arm 172 and the first nozzle 174a may be rotated about the central axis of the rotation shaft 176.

The support arm 172 may be provided in a rod shape oriented in a longitudinal direction orthogonal to the rotation shaft 176. A first end of the support arm 172 may be fixedly coupled to an upper end of the rotation shaft 176. The support arm 172 may be rotated about the first end thereof coupled to the rotation shaft 176. The first nozzle 174a may be coupled to a second end of the support arm 172. According to an example, a moving path of the first nozzle 174a may be provided to pass through the center of the substrate W when viewed from the top. Therefore, the first nozzle 174a may be moved to the process position and the standby position as the rotation shaft 176 and the support arm 172 may be rotated.

The second nozzle member 170b may include a second nozzle moving member and a second nozzle 174b. The second nozzle moving member may move the second nozzle 174b to a process position and a standby position. Here, the process position may be a position where the second nozzle 174b faces the substrate W supported by the substrate support unit 140, and the standby position may be a position where the second nozzle 174b is deviated from the process position. The second nozzle moving member may have the same configuration as the first nozzle moving member 171, so a detailed description thereof will be omitted.

The rinse nozzle member 170c may include a rinse nozzle moving member and a rinse nozzle 174c. The rinse nozzle member 170c may move the rinse nozzle 174c to a process position and a standby position. Here, the process position may be a position where the rinse nozzle 174c faces the substrate W supported by the substrate support unit 140, and the standby position may be a position where the rinse nozzle 174c is deviated from the process position. The rinse nozzle moving member may have the same configuration as the first nozzle moving member 171, so a detailed description thereof will be omitted.

The controller 150 may control the lifting unit 160 and the nozzle unit 170. The controller 150 may control each unit so that a first liquid supply step of supplying the first liquid on the substrate W and a second liquid supply step of supplying the second liquid on the substrate W are sequentially performed. The controller 150 may control the lifting unit 160 so that the substrate W corresponds to the first inlet 122a in the first liquid supply step and the substrate W corresponds to the second inlet 124a in the second liquid supply step.

According to an example, the controller 150 may lock the second nozzle member 170b so that the second liquid is not discharged while the first liquid is discharged, and may lock the first nozzle member 170a so that the first liquid is not discharged while the second liquid is discharged. Therefore, it is possible to prevent the first liquid and the second liquid from mixing.

Furthermore, the controller 150 may lock the second nozzle member 170b so that the second liquid is not discharged when the first inlet 122a of the processing container 120 is positioned to correspond to the substrate W, and may lock the first nozzle member 170a so that the first liquid is not discharged when the second inlet 124a of the processing container 120 is positioned to correspond to the substrate W. Therefore, it is possible to prevent the first liquid from being recovered to the second recovery tub 124 or the second liquid from being recovered to the first recovery tub 122.

Furthermore, the controller 150 may release the locking of one nozzle member positioned at the standby position among the first nozzle member 170a and the second nozzle member 170b. Therefore, it is possible to prevent a nozzle member for performing preliminary discharge from being locked.

The nozzle unit 170 may discharge a plurality of different chemical liquids and chemical liquids of different flow rates to the substrate W through the nozzle members 170a, 170b, and 170c. In the present disclosure, a chemical liquid supply unit 200 for supplying chemical liquids of different flow rates to the nozzle unit 170 is provided, and the substrate processing apparatus 100 to which the chemical liquid supply unit 200 according to the present disclosure is applied is also provided.

The chemical liquid supply unit 200 according to the present disclosure will be described through embodiments.

Figure 3:
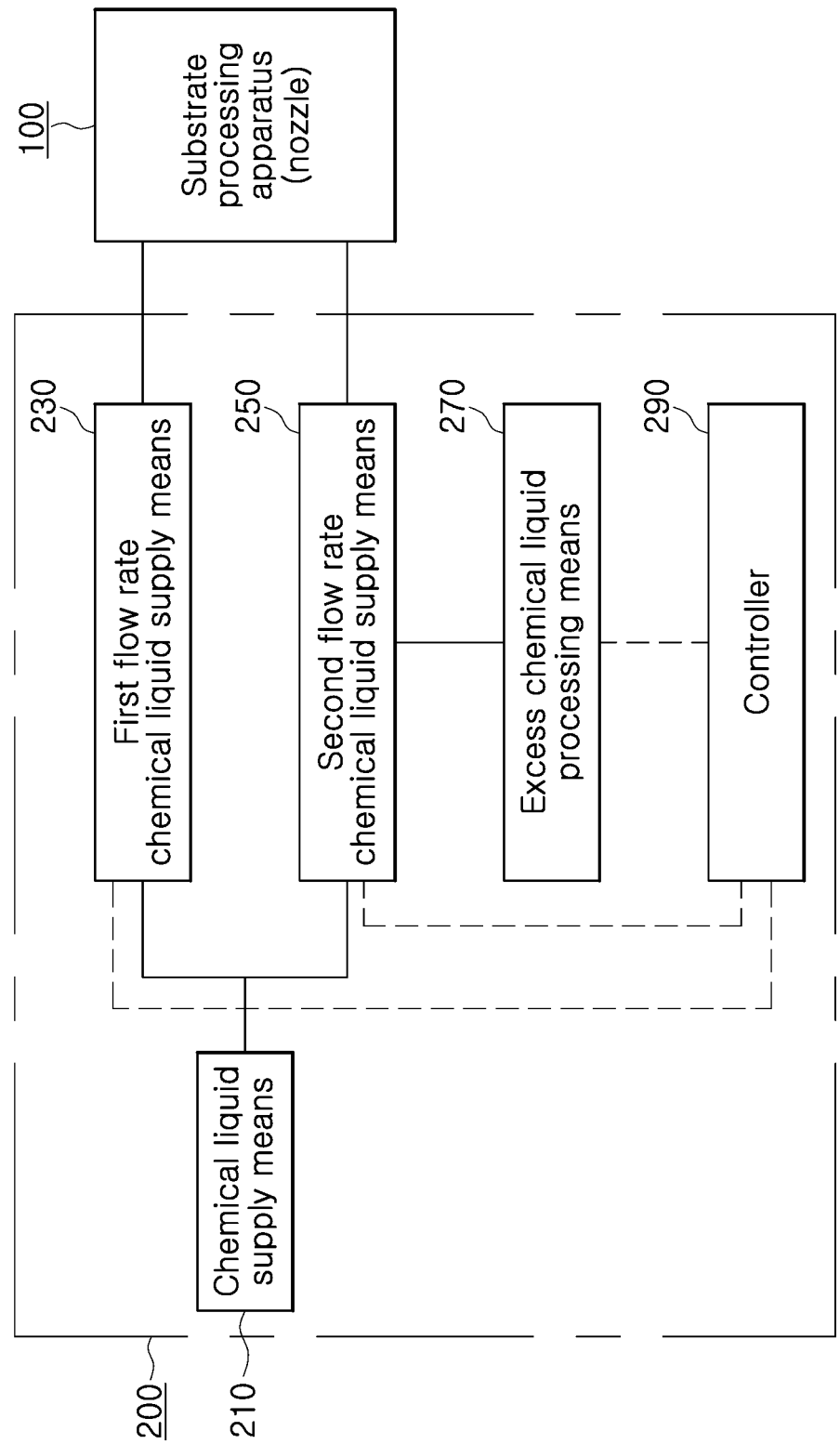
FIG. 3 is a block diagram illustrating the configuration of an embodiment of a chemical liquid supply unit according to the present disclosure.

FIG. 3 is a block diagram illustrating the configuration of an embodiment of a chemical liquid supply unit 200 according to the present disclosure.

The chemical liquid supply unit 200 may include a chemical liquid supply means 210 (i.e., a chemical supply source), a first flow rate chemical liquid supply means 230 (i.e., a first flow rate chemical liquid supply line), a second flow rate chemical liquid supply means 250 (i.e., a second flow rate chemical liquid supply line), an excess chemical liquid processing means 270 (i.e., an excess chemical line drain line), a controller 290, and the like.

The chemical liquid supply means 210 may include at least one chemical liquid sources, and may supply a chemical liquid from the chemical liquid source to the first flow rate chemical liquid supply means 230 and the second flow rate chemical liquid supply means 250.

As an example, the chemical liquid supply means 210 may supply a chemical liquid from one chemical liquid source, and alternatively, the chemical liquid supply means 210 may mix chemical liquids supplied from a plurality of chemical liquid sources in an adjusted mixing ratio and then supply the mixture at the same constant flow rate to each of the first flow rate chemical liquid supply means 230 and the second flow rate chemical liquid supply means 250.

Each of the first flow rate chemical liquid supply means 230 and the second flow rate chemical liquid supply means 250 may supply the chemical liquid at a different flow rate to a nozzle unit 170 of a substrate processing apparatus 100.

For example, the first flow rate chemical liquid supply means 230 may supply a high flow rate chemical liquid to the nozzle unit 170 of the substrate processing apparatus 100, and the second flow rate chemical liquid supply means 250 may supply a low flow rate chemical liquid to the nozzle unit 170 of the substrate processing apparatus 100.

The first flow rate chemical liquid supply means 230 may supply the chemical liquid supplied from the chemical liquid supply means 210 to the nozzle unit 170 of the substrate processing apparatus 100, without adjusting the flow rate of the chemical liquid.

The second flow rate chemical liquid supply means 250 may adjust the flow rate of the chemical liquid supplied from the chemical liquid supply means 210 to a flow rate required in a corresponding substrate processing process, and supply the chemical liquid at the adjusted flow rate to the nozzle unit 170 of the substrate processing apparatus 100.

To this end, the second flow rate chemical liquid supply means 250 may include a flow control valve to adjust the flow rate of the chemical liquid supplied from the chemical liquid supply means 210.

In other words, in the chemical liquid supply unit 200 according to the present disclosure, while the chemical liquids of the same flow rate are supplied from one chemical liquid supply means 210, the first flow rate chemical liquid supply means 230 and the second flow rate chemical liquid supply means 250 may adjust the flow rate to different flow rates to selectively supply the chemical liquids of different flow rates to the nozzle unit 170 of the substrate processing apparatus 100.

The excess chemical liquid processing means 270 may process an excess chemical liquid remaining after the flow rate of the chemical liquid is adjusted through the second flow rate chemical liquid supply means 250.

As an example, the excess chemical liquid processing means 270 may discharge the excess chemical liquid remaining after the flow rate is adjusted through the second flow rate chemical liquid supply means 250 to the outside.

As another example, the excess chemical liquid processing means 270 may recover the excess chemical liquid remaining after the flow rate is adjusted through the second flow rate chemical liquid supply means 250 and provide the recovered chemical liquid for reuse in the chemical liquid supply means 210.

The controller 290 may control the first flow rate chemical liquid supply means 230 and the second flow rate chemical liquid supply means 250 to selectively supply the chemical liquids of different flow rates to the nozzle unit 170 of the substrate processing apparatus 100.

As an example, the controller 290 may control the flow control valve provided at the second flow rate chemical liquid supply means 250 to adjust the flow rate of the chemical liquid to a flow rate required in the corresponding substrate processing process. Furthermore, the controller 290 may control a valve provided at each of the first flow rate chemical liquid supply means 230 and the second flow rate chemical liquid supply means 250 to selectively control the flow of the chemical liquid to be supplied to the nozzle unit 170 of the substrate processing apparatus 100.

Moreover, the controller 290 may control the excess chemical liquid processing means 270 to discharge the excess chemical liquid to the outside through the excess chemical liquid processing means 270 or to recover the excess chemical liquid for reuse.

The chemical liquid supply unit 200 according to the present disclosure will be described in more detail through specific embodiments.

Figure 4:
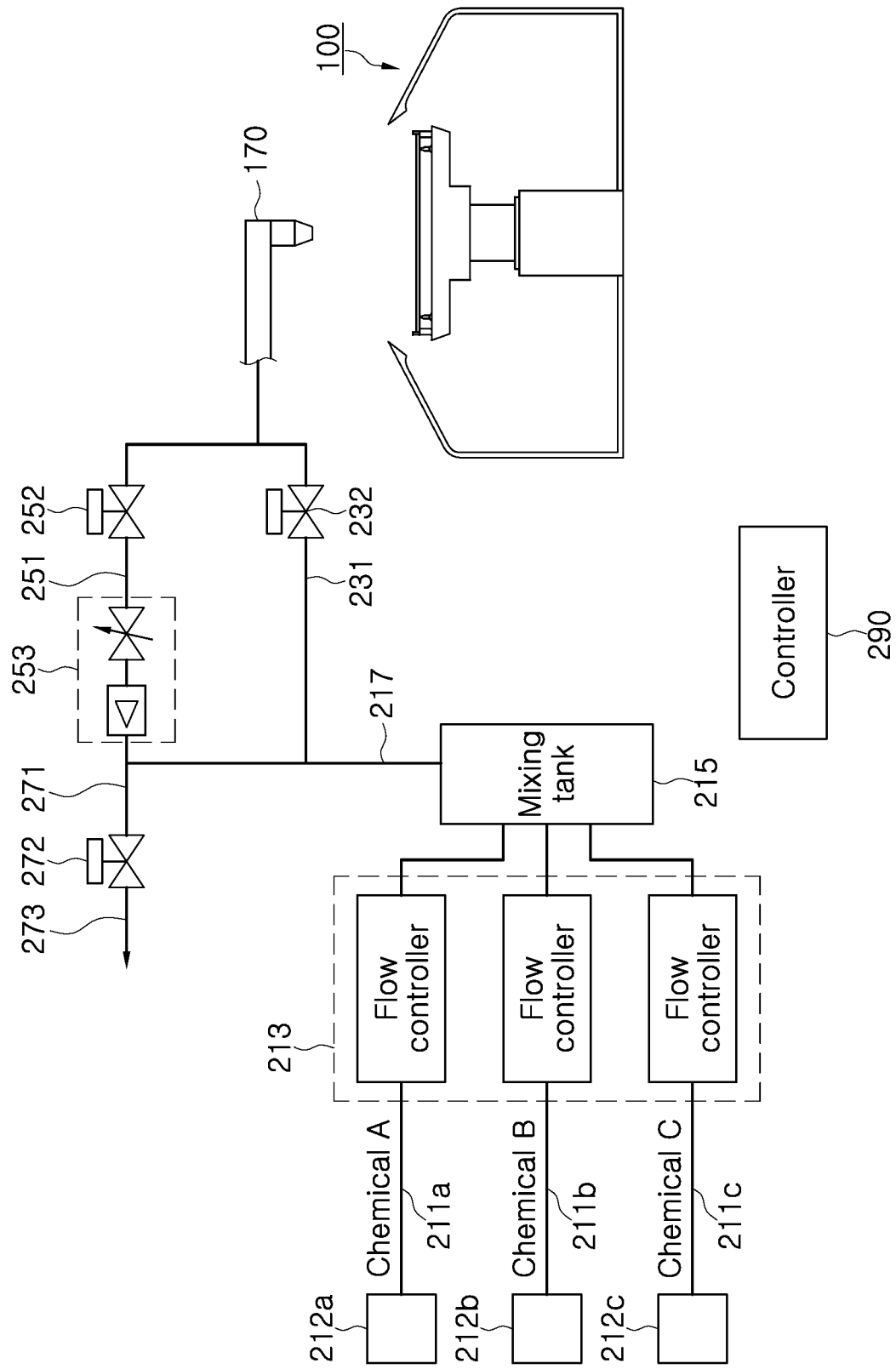
FIG. 4 is a view illustrating a first embodiment of a chemical liquid supply unit according to the present disclosure.

FIG. 4 is a view illustrating a first embodiment of a chemical liquid supply unit 200 according to the present disclosure.

A chemical liquid supply means 210 may include a plurality of chemical liquid sources 211a, 211b, and 211c of a plurality of chemical liquids A, B, and C to provide the chemical liquids A, B, and C, and may include a flow controller 213 for adjusting the flow rate of each of the chemical liquid sources 211a, 211b, and 211c to adjust the ratio of each of the chemical liquids A, B, and C to be supplied. In an embodiment, the plurality of chemical sources 211a, 211b, and 211c may include a plurality of chemical liquid supply tanks 212a, 212b, and 212c, respectively. The plurality of chemical liquid supply tanks 212a, 212b, and 212c may store the chemical liquids A, B, and C different from each other in kind.

The chemical liquid supply means 210 may mix the chemical liquids B, and C in a required mixing ratio in a mixing tank 215 to form and supply a mixed chemical liquid. In this embodiment, the chemical liquid supply means 210 is described as being provided with the mixing tank 215 to mix and supply the plurality of chemical liquids, but depending on situation, the chemical liquid supply means 210 may be provided with a simple mixer to mix and supply the plurality of chemical liquids.

The chemical liquid supply means 210 may supply the chemical liquid to each of a first flow rate chemical liquid supply means 230 and a second flow rate chemical liquid supply means 250 through a chemical liquid supply line 217 connected to the mixing tank 215.

The chemical liquid supply line 217 may have a first side connected to the mixing tank 215 and a second side branched into a plurality of branch lines, and may supply the chemical liquid to the first flow rate chemical liquid supply means 230 through one of the branch lines and supply the chemical liquid to the second flow rate chemical liquid supply means 250 through another one of the branch lines.

Here, the chemical liquid supply line 217 may supply chemical liquids of the same flow rate to the first flow rate chemical liquid supply means 230 and the second flow rate chemical liquid supply means 250.

The first flow rate chemical liquid supply means 230 may include a first chemical liquid line 231. The first chemical liquid line 231 may be connected to one of the branch lines of the chemical liquid supply line 217 to receive the chemical liquid.

Furthermore, the first flow rate chemical liquid supply means 230 may include a first chemical liquid line valve 232 disposed on the first chemical liquid line 231. Opening and closing operations of the first chemical liquid line valve 232 may be operated under control of a controller 290, so that the chemical liquid may be selectively supplied to a nozzle unit 170 of a substrate processing apparatus 100 through the first chemical liquid line 231.

As an example, the chemical liquid supply line 217 may supply a chemical liquid of a first flow rate, and the first flow rate chemical liquid supply means 230 may supply the chemical liquid of the first flow rate supplied from the chemical liquid supply line 217 to the nozzle unit 170 of the substrate processing apparatus 100, without adjusting the first flow rate of the chemical liquid. For example, when a substrate processing process is performed using a high flow rate chemical liquid, the high flow rate chemical liquid may be supplied to the nozzle unit 170 of the substrate processing apparatus 100 through the first flow rate chemical liquid supply means 230 and discharged in a liquid state to a substrate W through the nozzle unit 170.

The second flow rate chemical liquid supply means 250 may include a second chemical liquid line 251. The second chemical liquid line 251 may be connected to another one of the branch lines of the chemical liquid supply line 217 to receive the chemical liquid.

The second flow rate chemical liquid supply means 250 may include a flow control valve 253 and a second chemical liquid line valve 252 disposed on the second chemical liquid line 251.

The controller 290 may control the flow control valve 253 to adjust the flow rate of the chemical liquid of the second chemical liquid line 251 to a flow rate required in a corresponding substrate processing process. As the flow control valve 253, various methods for finely adjusting the flow rate may be employed. As an example, a needle valve may be employed to adjust the flow rate of the chemical liquid flowing on the second chemical liquid line 251 to a fine level.

The controller 290 may control opening and closing operations of the second chemical liquid line valve 252 to selectively supply the chemical liquid at the adjusted flow rate to the nozzle unit 170 of the substrate processing apparatus 100 through the second chemical liquid line 251.

As an example, the second flow rate chemical liquid supply means 250 may receive the chemical liquid of the first flow rate from the chemical liquid supply line 217 at the same flow rate as the first chemical liquid supply means 230, and may adjust the first flow rate to a second flow rate required in the corresponding substrate processing process through the flow control valve 253 and supply a chemical liquid of the second flow rate to the nozzle unit 170 of the substrate processing apparatus 100. For example, when a substrate processing process is performed using a low flow rate chemical liquid, the low flow rate chemical liquid may be supplied to the nozzle unit 170 of the substrate processing apparatus 100 through the second flow rate chemical liquid supply means 250 and discharged in a spray state to the substrate W through the nozzle unit 170.

The chemical liquid supply line 217 of the chemical liquid supply means 210 may supply the chemical liquids of the same flow rate to the first chemical liquid line 231 and the second chemical liquid line 251. However, since the second flow rate chemical liquid supply means 250 may supply the chemical liquid at the adjusted flow rate to the nozzle unit 170 of the substrate processing apparatus 100, an excess chemical liquid may remain.

An excess chemical liquid processing means 270 may include an excess chemical liquid line 271, an excess chemical liquid valve 272, a drain line 273, and the like for processing the excess chemical liquid remaining after the flow rate is adjusted through the second chemical liquid line 251.

The excess chemical liquid except for the chemical liquid of which the flow rate is adjusted through the second flow rate chemical liquid supply means 250 from the chemical liquid supplied from the chemical liquid supply line 217 may be introduced into the excess chemical liquid line 271, and the controller 290 may control opening and closing operations of the excess chemical liquid valve 272 to discharge the excess chemical liquid to the outside through the drain line 273.

In other words, in the chemical liquid supply unit 200 according to the present disclosure, while the chemical liquids of the same flow rate are supplied from one chemical liquid supply means 210, the first flow rate chemical liquid supply means 230 and the second flow rate chemical liquid supply means 250 may selectively supply the chemical liquids of different flow rates to the nozzle unit 170 of the substrate processing apparatus 100.

Furthermore, in the present disclosure, the excess chemical liquid processing means 270 for processing the excess chemical liquid remaining after the flow rate is adjusted through the second flow rate chemical liquid supply means 250 may be variously modified. The excess chemical liquid processing means 270 will be described in more detail through various embodiments.

Figure 5:
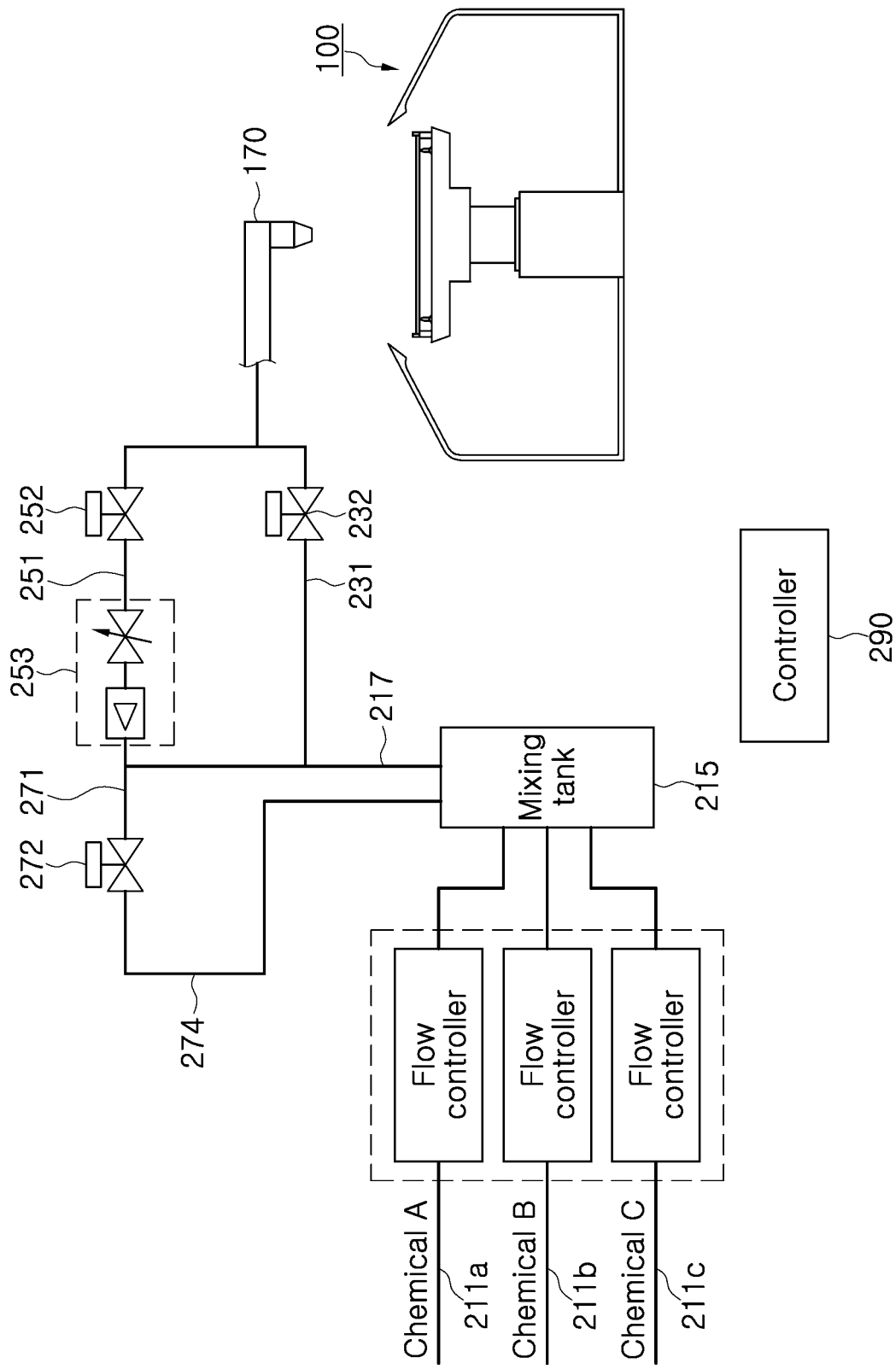
FIG. 5 is a view illustrating a second embodiment of a chemical liquid supply unit according to the present disclosure.

FIG. 5 is a view illustrating a second embodiment of a chemical liquid supply unit 200 according to the present disclosure.

In the second embodiment of the chemical liquid supply unit 200, a chemical liquid supply means 210, a first flow rate chemical liquid supply means 230, a second flow rate chemical liquid supply means 250, and the like remain the same as or similar to those of the first embodiment of the chemical liquid supply unit 200 described above, so a detailed description thereof will be omitted in order to avoid an overlapping description.

An excess chemical liquid processing means 270 may include an excess chemical liquid line 271, an excess chemical liquid valve 272, a recovery line 274, and the like for recovering and reusing an excess chemical liquid remaining after the flow rate of a chemical liquid is adjusted through a second chemical liquid line 251.

The excess chemical liquid except for the chemical liquid of which the flow rate is adjusted through the second flow rate chemical liquid supply means 250 from the chemical liquid supplied from a chemical liquid supply line 217 may be introduced into the excess chemical liquid line 271, and a controller 290 may control opening and closing operations of the excess chemical liquid valve 272 to recover the excess chemical liquid through the recovery line 274.

The recovery line 274 may be connected to a mixing tank 215 of the chemical liquid supply unit 200, so that the recovered chemical liquid recovered through the recovery line 274 may be supplied to the mixing tank 215 of the chemical liquid supply unit 200 to be used again.

Furthermore, the recovery line 274 may be connected to the chemical liquid supply line 217 of the chemical liquid supply means 210, so that the recovered chemical liquid recovered through the recovery line 274 may be directly supplied to the first flow rate chemical liquid supply means 230 and the second flow rate chemical liquid supply means 250 without passing through the mixing tank 215.

Figure 6:
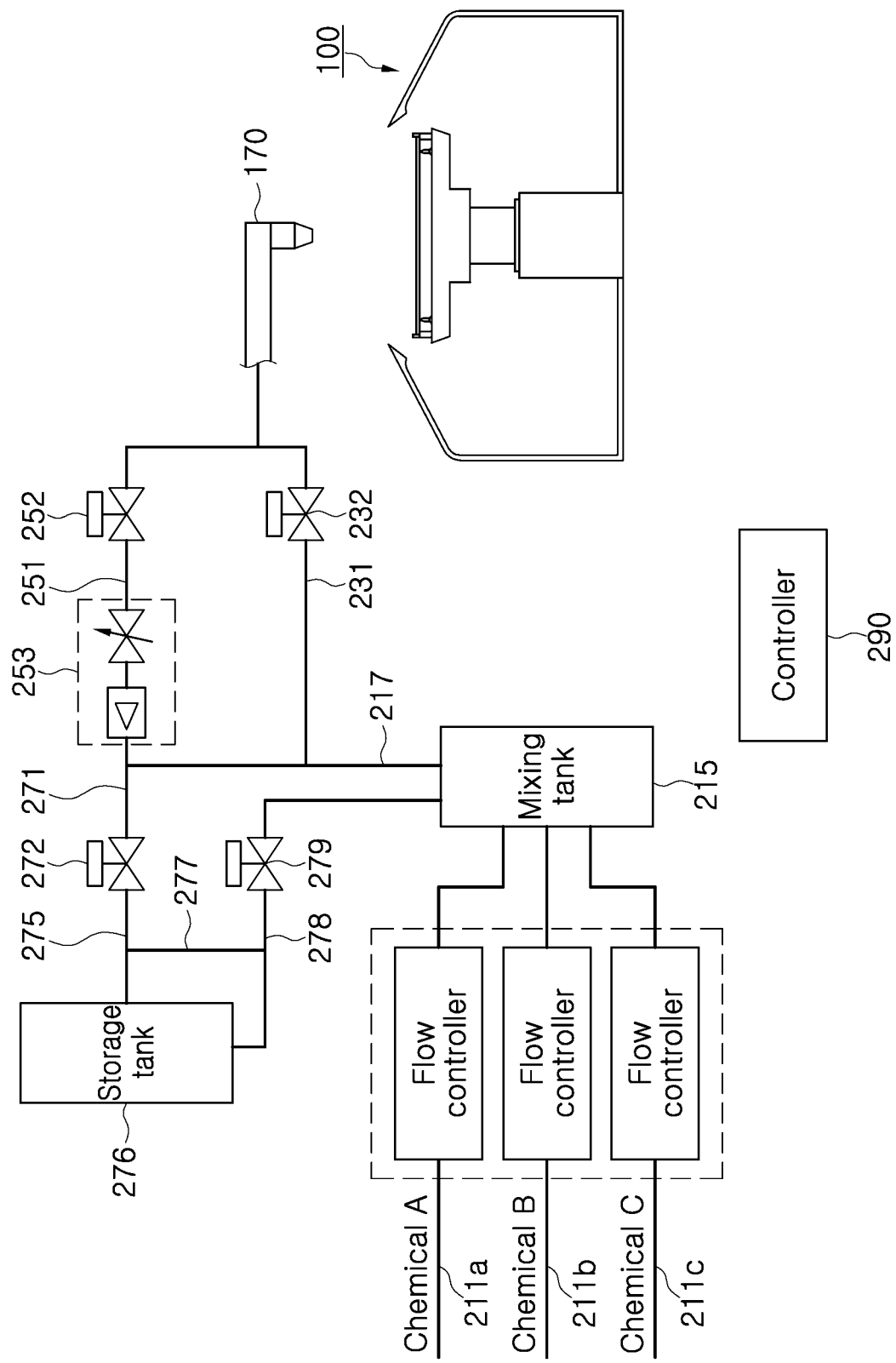
FIGS. 6 and 7 are views illustrating a third embodiment of a chemical liquid supply unit according to the present disclosure.
Figure 7:
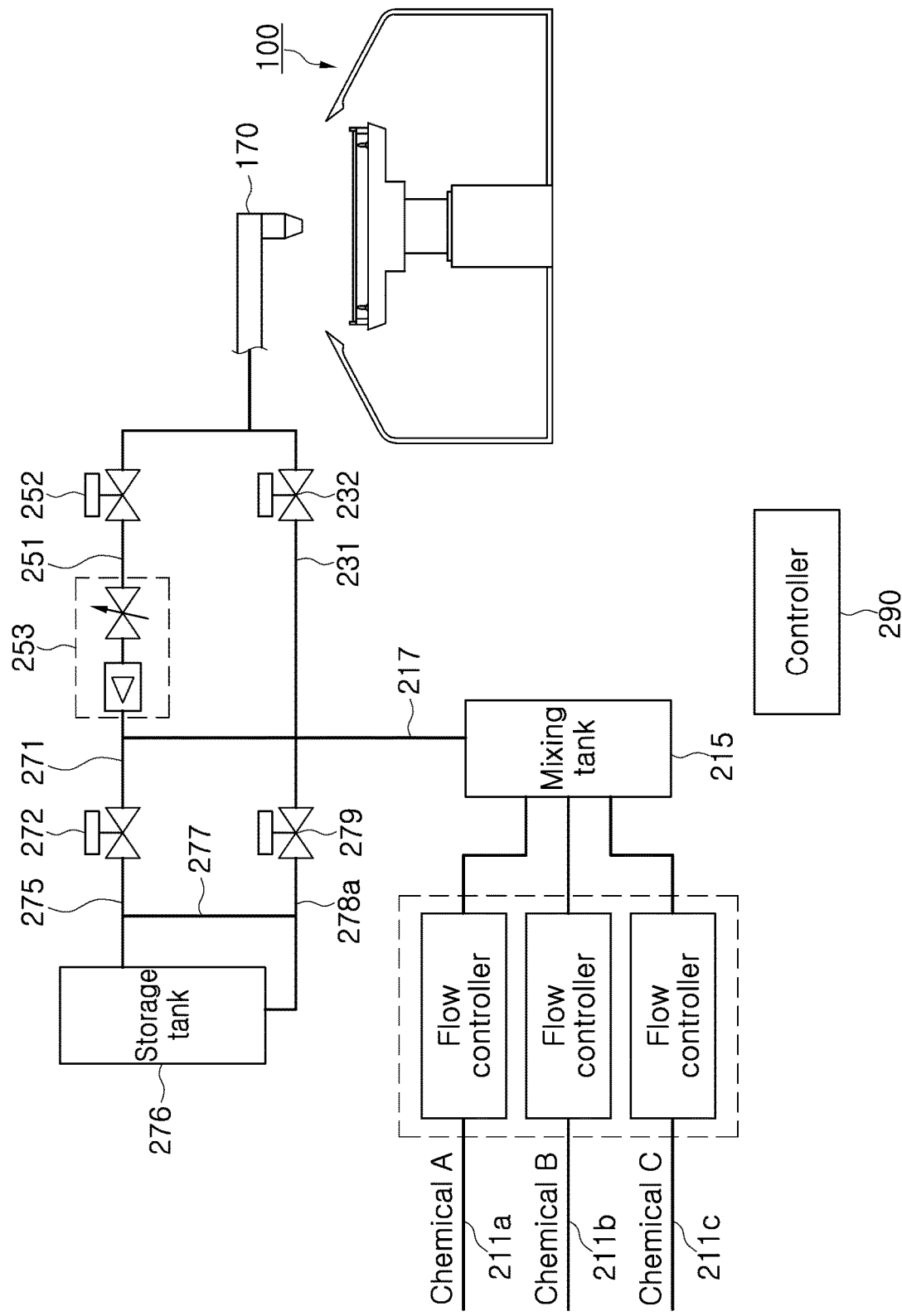

FIGS. 6 and 7 are views illustrating a third embodiment of a chemical liquid supply unit 200 according to the present disclosure.

In the third embodiment of the chemical liquid supply unit 200, a chemical liquid supply means 210, a first flow rate chemical liquid supply means 230, a second flow rate chemical liquid supply means 250, and the like remain the same as or similar to those of the first embodiment of the chemical liquid supply unit 200 described above, so a detailed description thereof will be omitted in order to avoid an overlapping description.

An excess chemical liquid processing means 270 may include an excess chemical liquid line 271, an excess chemical liquid valve 272, a recovery line 275, a storage tank 276, a recovered chemical liquid supply line 278, a recovery valve 279, and the like for recovering and reusing an excess chemical liquid remaining after the flow rate of a chemical liquid is adjusted through a second chemical liquid line 251.

The excess chemical liquid except for the chemical liquid of which the flow rate is adjusted through the second flow rate chemical liquid supply means 250 from the chemical liquid supplied from a chemical liquid supply line 217 may be introduced into the excess chemical liquid line 271, and a controller 290 may control opening and closing operations of the excess chemical liquid valve 272 to recover the excess chemical liquid through the recovery line 275. The recovery line 274 may be connected to the storage tank 276 to supply the recovered chemical liquid to the storage tank 276.

The storage tank 276 may temporarily store the recovered chemical liquid.

In the embodiment of FIG. 6, the recovered chemical liquid stored in the storage tank 276 may be supplied to a mixing tank 215 of the chemical liquid supply unit 200 through the recovered chemical liquid supply line 278 to be used again.

In the embodiment of FIG. 7, the recovered chemical liquid stored in the storage tank 276 may be supplied to the chemical liquid supply line 217 of the chemical liquid supply unit 200 through a recovered chemical liquid supply line 278a to be used again.

The controller 290 may control the recovery valve 279 disposed on the recovered chemical liquid supply line 278 to selectively provide the recovered chemical liquid stored in the storage tank 276.

The excess chemical liquid processing means 270 may further include a circulation line 277. A heater (not illustrated), a pump (not illustrated), a filter (not illustrated), and the like may be disposed on the circulation line 277. While the recovered chemical liquid stored in the storage tank 276 is circulated through the circulation line 277, the recovered chemical liquid may be adjusted according to control of chemical liquid supply. A new chemical liquid for adjusting the recovered chemical liquid may be supplied to the storage tank 276 or the circulation line 277 as needed.

As described above, the chemical liquid supply unit 200 according to the present disclosure may selectively supply the chemical liquid at different flow rates to the nozzle unit 170 of the substrate processing apparatus 100 through the first flow rate chemical liquid supply means 230 and the second flow rate chemical liquid supply means 250 and may recover and reuse the excess chemical liquid remaining after flow rate adjustment.

In the present disclosure, a method of supplying a chemical liquid through the above-described chemical liquid supply unit according to the present disclosure is provided. Hereinafter, a chemical liquid supply method according to the present disclosure will be described through embodiments. Since the chemical liquid supply method according to the present disclosure may be implemented in the above-described chemical liquid supply unit according to the present disclosure, the embodiments of the chemical liquid supply unit according to the present disclosure will be referred to together.

Figure 8:
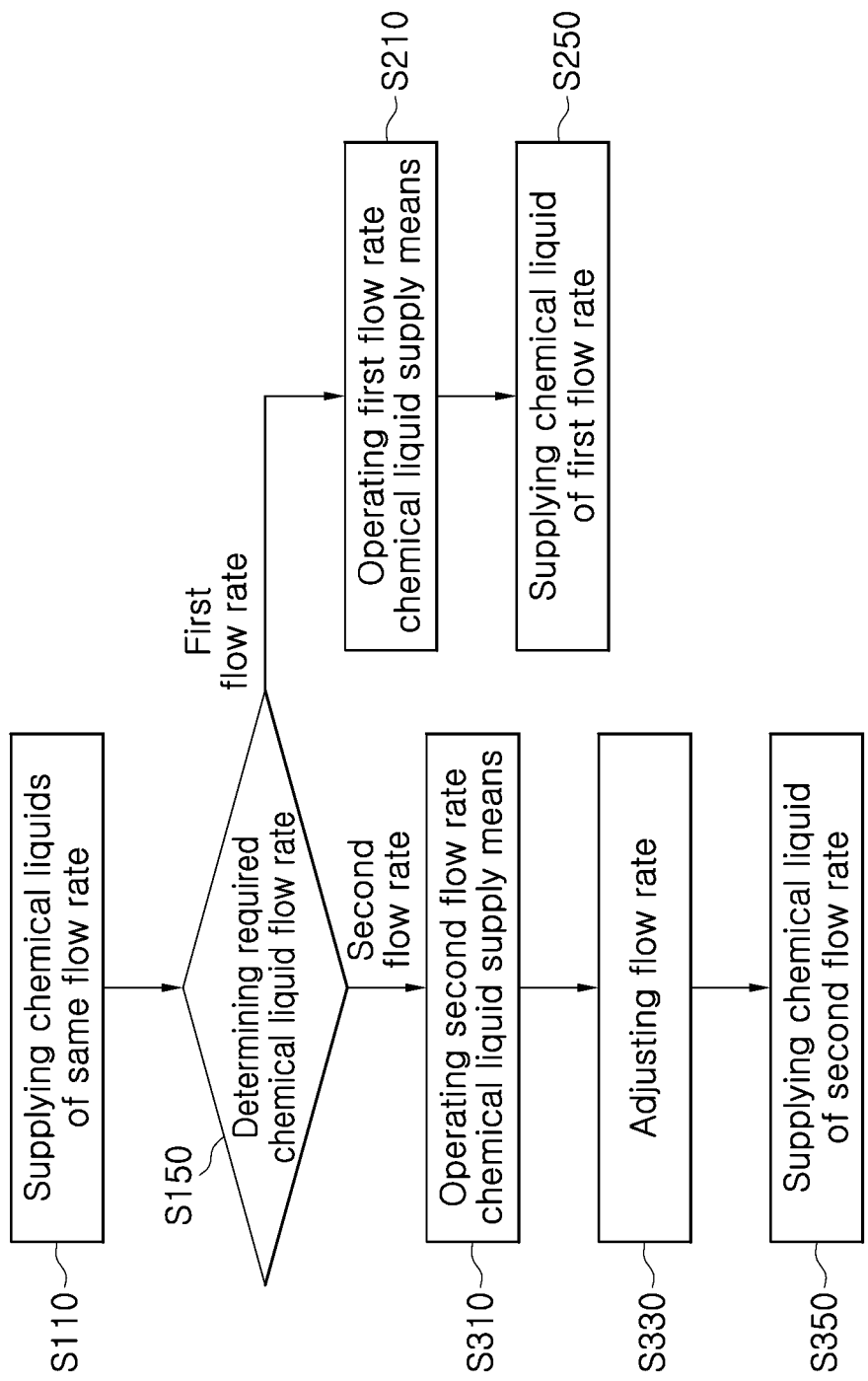
FIG. 8 is a flowchart illustrating an embodiment of a chemical liquid supply method according to the present disclosure.

FIG. 8 is a flowchart illustrating an embodiment of a chemical liquid supply method according to the present disclosure.

A chemical liquid supply means 210 may supply a chemical liquid to each of a first flow rate chemical liquid supply means 230 and a second flow rate chemical liquid supply means 250. At this time, a chemical liquid of a first flow rate may be supplied to each of a first chemical liquid line 231 of the first flow rate chemical liquid supply means 230 and a second chemical liquid line 251 of the second flow rate chemical liquid supply means 250, the first and second liquid lines 231 and 251 being branched from a chemical liquid supply line 217 (S110).

Here, the chemical liquid supplied by the chemical liquid supply means 210 may be one chemical liquid or a mixed chemical liquid in which a plurality of different chemical liquids are mixed in a required mixing ratio.

A controller 290 may determine a required chemical liquid flow rate required in a corresponding substrate processing process (S150), and when the first flow rate is required, the controller 290 may selectively operate the first flow rate chemical liquid supply means 230 (S210). At this time, the controller 290 may stop the operation of the second flow rate chemical liquid supply means 250.

The first flow rate chemical liquid supply means 230 may supply the chemical liquid of the first flow rate supplied from the chemical liquid supply means 210, without adjusting the first flow rate of the chemical liquid, and the first flow rate chemical liquid supply means 230 may supply the chemical liquid of the first flow rate to a nozzle unit 170 of a substrate processing apparatus 100 under control of the controller 290 (S250).

On the other hand, when a second flow rate is required as a result of the determination on the required chemical liquid flow rate required in the corresponding substrate processing process (S150), the controller 290 may selectively operate the second flow rate chemical liquid supply means 250 (S310). At this time, the controller 290 may stop the operation of the first flow rate chemical liquid supply means 230.

The controller 290 may control the second flow rate chemical liquid supply means 250 to adjust the flow rate of the supplied chemical liquid (S330), and may adjust the first flow rate of the chemical liquid supplied from the chemical liquid supply means 210 to the second flow rate (S330).

The second flow rate chemical liquid supply means 250 may supply a chemical liquid of a second flow rate to the nozzle unit 170 of the substrate processing apparatus 100 under control of the controller 290 (S350).

Each process of the chemical liquid supply method according to the present disclosure will be described in more detail through more specific embodiments.

Figure 9:
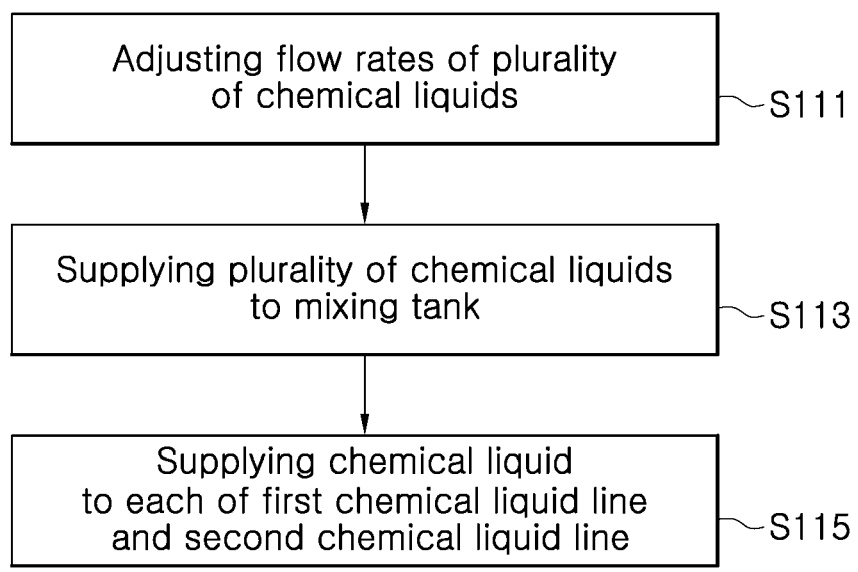
FIG. 9 is a flowchart illustrating an embodiment in which a chemical liquid is supplied through a chemical liquid supply means in the chemical liquid supply method according to the present disclosure.

FIG. 9 is a flowchart illustrating an embodiment in which a chemical liquid is supplied through a chemical liquid supply means 210 in the chemical liquid supply method according to the present disclosure.

The chemical liquid supply means 210 may supply a mixed chemical liquid in which a plurality of different chemical liquids are mixed in a required mixing ratio.

To this end, the chemical liquid supply means 210 may receive the chemical liquids from a plurality of chemical liquid sources 211a, 211b, and 211c, and adjust the flow rate of each of the chemical liquids through a flow controller 213 according to the required mixing ratio (S111).

The chemical liquids of which the flow rates are adjusted may be supplied to the mixing tank 215 of the chemical liquid supply means 210 (S113) and mixed in the mixing tank 215 to form the mixed chemical liquid.

The chemical liquid in the mixing tank 215 may be supplied to each of a first chemical liquid line 231 of the first flow rate chemical liquid supply means 230 and a second chemical liquid line 251 of the second flow rate chemical liquid supply means 250 through a chemical liquid supply line 217 of the chemical liquid supply means 210 (S115).

At this time, the flow rates of the chemical liquids supplied from the chemical liquid supply line 217 to the first chemical liquid line 231 and the second chemical liquid line 251 may be the same.

Next, an example of supplying a chemical liquid of a first flow rate to a processing unit of a substrate processing apparatus 100 according to the present disclosure will be described.

Figure 10:
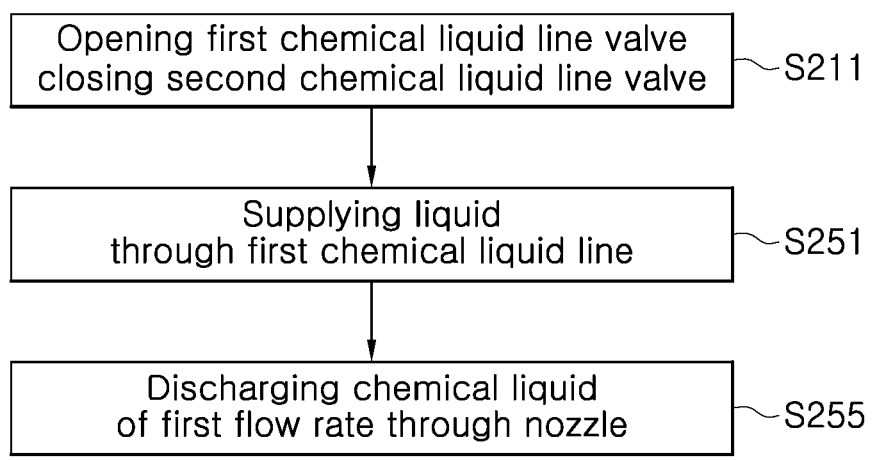
FIG. 10 is a flowchart illustrating an embodiment in which a chemical liquid is supplied at a first flow rate in the chemical liquid supply method according to the present disclosure.
Figure 11:
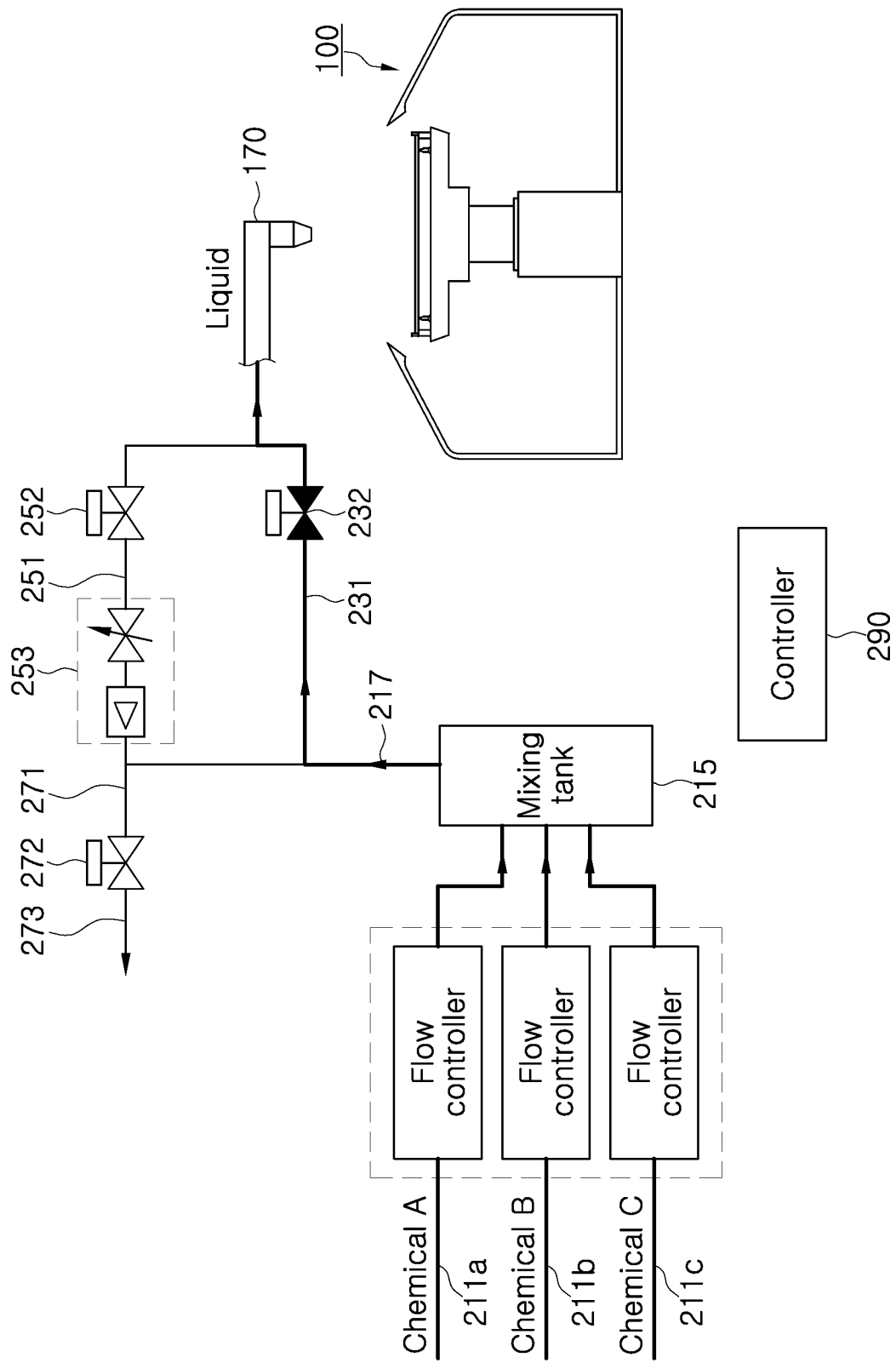
FIG. 11 is a view illustrating the embodiment in which the chemical liquid is supplied at the first flow rate in the substrate processing apparatus according to the present disclosure.

FIG. 10 is a flowchart illustrating an embodiment in which a chemical liquid is supplied at a first flow rate in the chemical liquid supply method according to the present disclosure. FIG. 11 is a view illustrating the embodiment in which the chemical liquid is supplied at the first flow rate in the substrate processing apparatus 100 according to the present disclosure.

A controller 290 may determine a required chemical liquid flow rate required in a corresponding substrate processing process, and when the first flow rate is required, may open a first chemical liquid line valve 232 disposed on a first chemical liquid line 231 and close a second chemical liquid line valve 252 disposed on a second chemical liquid line 251 (S211).

With the opening of the first chemical liquid line valve 232, the chemical liquid of the first flow rate may be supplied to a nozzle unit 170 of the substrate processing apparatus 100 through the first chemical liquid line 231 (S251).

Here, since a first flow rate chemical liquid supply means 230 may supply the chemical liquid supplied from a chemical liquid supply line 217 of a chemical liquid supply means 210 without adjusting the first flow rate of the chemical liquid, the chemical liquid supplied to the nozzle unit 170 of the substrate processing apparatus 100 through the first flow rate chemical liquid supply means 230 may be a first flow rate chemical liquid having a high flow rate. Therefore, a high flow rate chemical liquid may be discharged in a liquid state through the nozzle unit 170 of the substrate processing apparatus 100 (S255).

Next, an example of supplying a chemical liquid of a second flow rate to a processing unit of a substrate processing apparatus 100 and processing an excess chemical liquid according to the present disclosure will be described.

Figure 12:
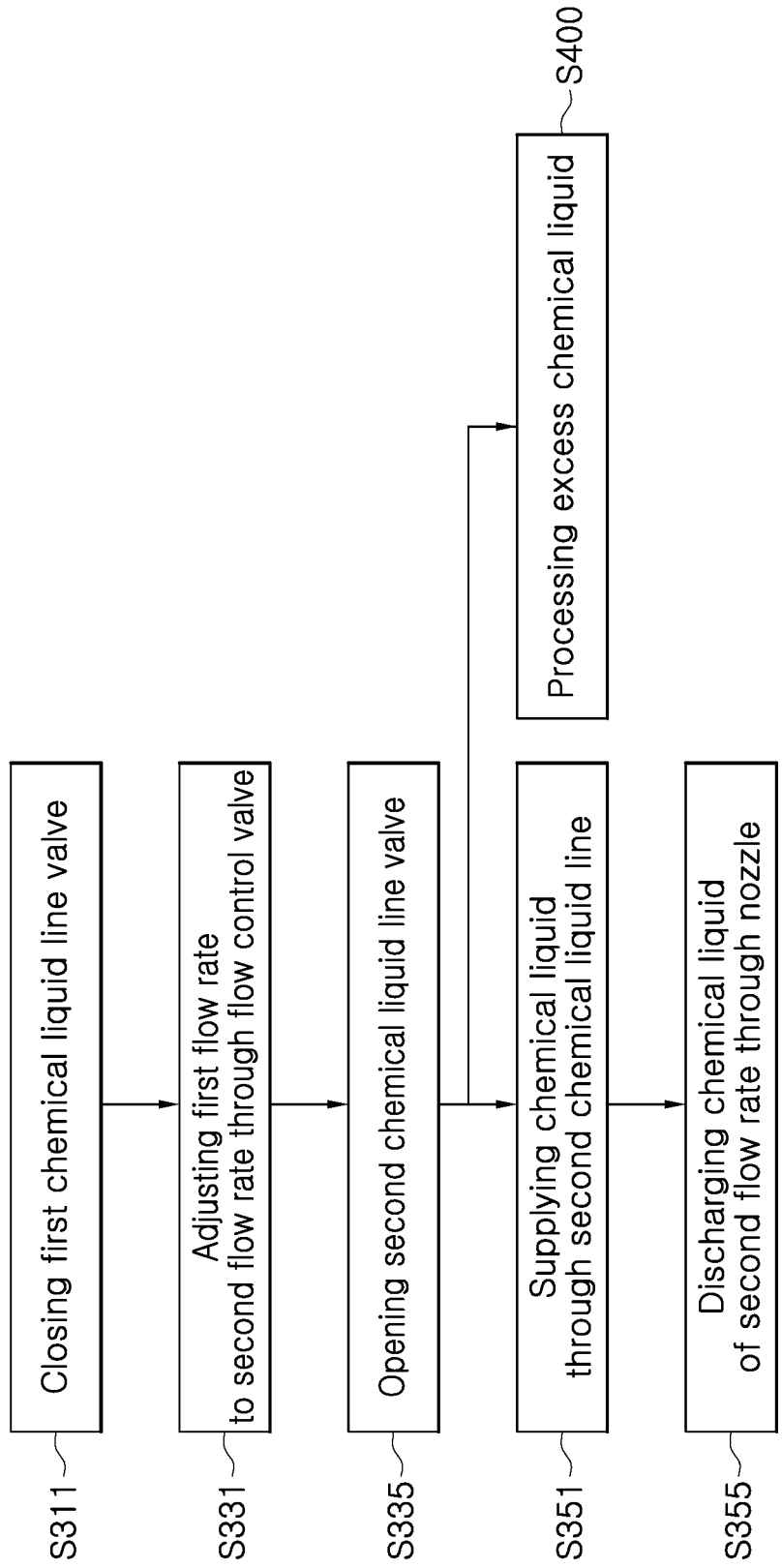
FIG. 12 is a flowchart illustrating an embodiment in which a chemical liquid is supplied at a second flow rate in the chemical liquid supply method according to the present disclosure.
Figure 13:
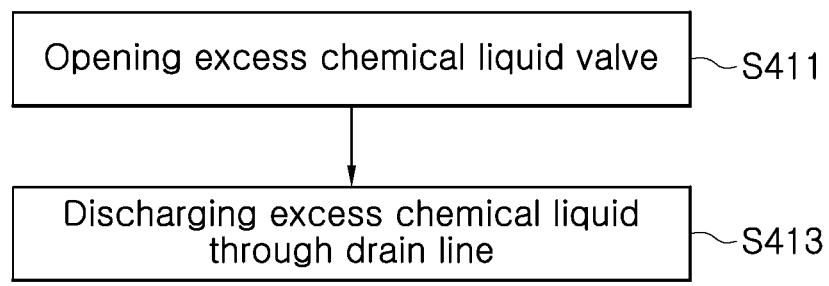
FIG. 13 is a flowchart illustrating a first embodiment of processing an excess chemical liquid in the chemical liquid supply method according to the present disclosure.
Figure 14:
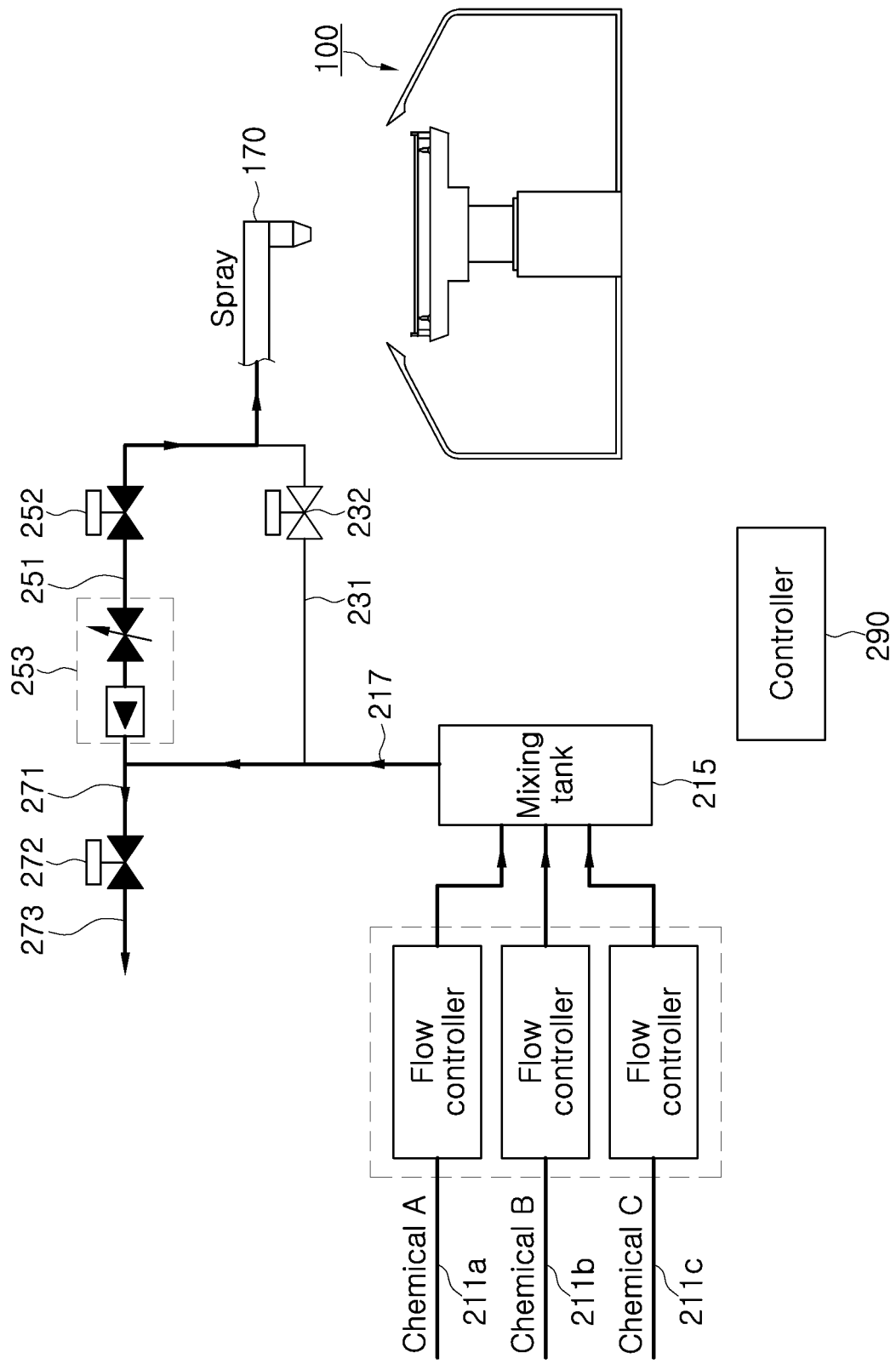
FIG. 14 is a view illustrating the first embodiment of processing the excess chemical liquid in the substrate processing apparatus according to the present disclosure.

FIG. 12 is a flowchart illustrating an embodiment in which a chemical liquid is supplied at a second flow rate in the chemical liquid supply method according to the present disclosure. FIG. 13 is a flowchart illustrating a first embodiment of processing an excess chemical liquid in the chemical liquid supply method according to the present disclosure. FIG. 14 is a view illustrating the first embodiment of processing the excess chemical liquid in the substrate processing apparatus 100 according to the present disclosure.

First, a process of supplying the chemical liquid at the second flow rate will be described with reference to the embodiments of FIGS. 12 and 14.

A controller 290 may determine a required chemical liquid flow rate required in a corresponding substrate processing process, and when the second flow rate is required, may close a first chemical liquid line valve 232 (S311).

Then, the controller 290 may control a flow control valve 253 disposed on a second chemical liquid line 251 to adjust a first flow rate of a chemical liquid flowing on the second chemical liquid line 251 to the second flow rate (S331).

When the flow rate is adjusted to a required flow rate level through the flow control valve 253, the controller 290 may open a second chemical liquid line valve 252 disposed on the second chemical liquid line 251 (S335) to supply the chemical liquid of the second flow rate to a nozzle unit 170 of the substrate processing apparatus 100 (S351).

Here, since the controller 290 may adjust the first flow rate of the chemical liquid supplied from a chemical liquid supply line 217 of a chemical liquid supply means 210 to the second flow rate through the flow control valve 253 of a second flow rate chemical liquid supply means 250, the chemical liquid supplied to the nozzle unit 170 of the substrate processing apparatus 100 through the second flow rate chemical liquid supply means 250 may be a second flow rate chemical liquid having a low flow rate. Therefore, a low flow rate chemical liquid may be discharged in a spray state through the nozzle unit 170 of the substrate processing apparatus 100 (S355).

Since the second flow rate chemical liquid supply means 250 may supply the chemical liquid of the second flow rate having a relatively small flow rate by adjusting the chemical liquid of the first flow rate supplied from the chemical liquid supply means 210, the excess chemical liquid except for the chemical liquid of the second flow rate from the chemical liquid of the first flow rate may remain.

An excess chemical liquid processing means 270 may process the excess chemical liquid remaining after the chemical liquid of the second flow rate is supplied through the second flow rate chemical liquid supply means 250 (S400).

A process of processing the excess chemical liquid remaining after supplying the chemical liquid of the second flow rate will be described with reference to the embodiments of FIGS. 13 and 14.

The excess chemical liquid remaining in the second flow rate chemical liquid supply means 250 may be introduced into an excess chemical liquid line 271 of the excess chemical liquid processing means 270.

The controller 290 may selectively open an excess chemical liquid valve 272 disposed on the excess chemical liquid line 271 to discharge the excess chemical liquid to the outside through a drain line 273 (S413).

Figure 15:
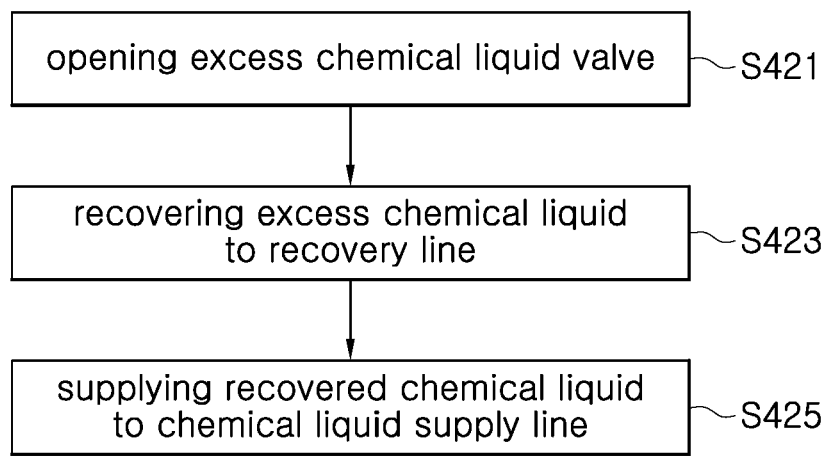
FIG. 15 is a flowchart illustrating a second embodiment of processing an excess chemical liquid in the chemical liquid supply method according to the present disclosure.
Figure 16:
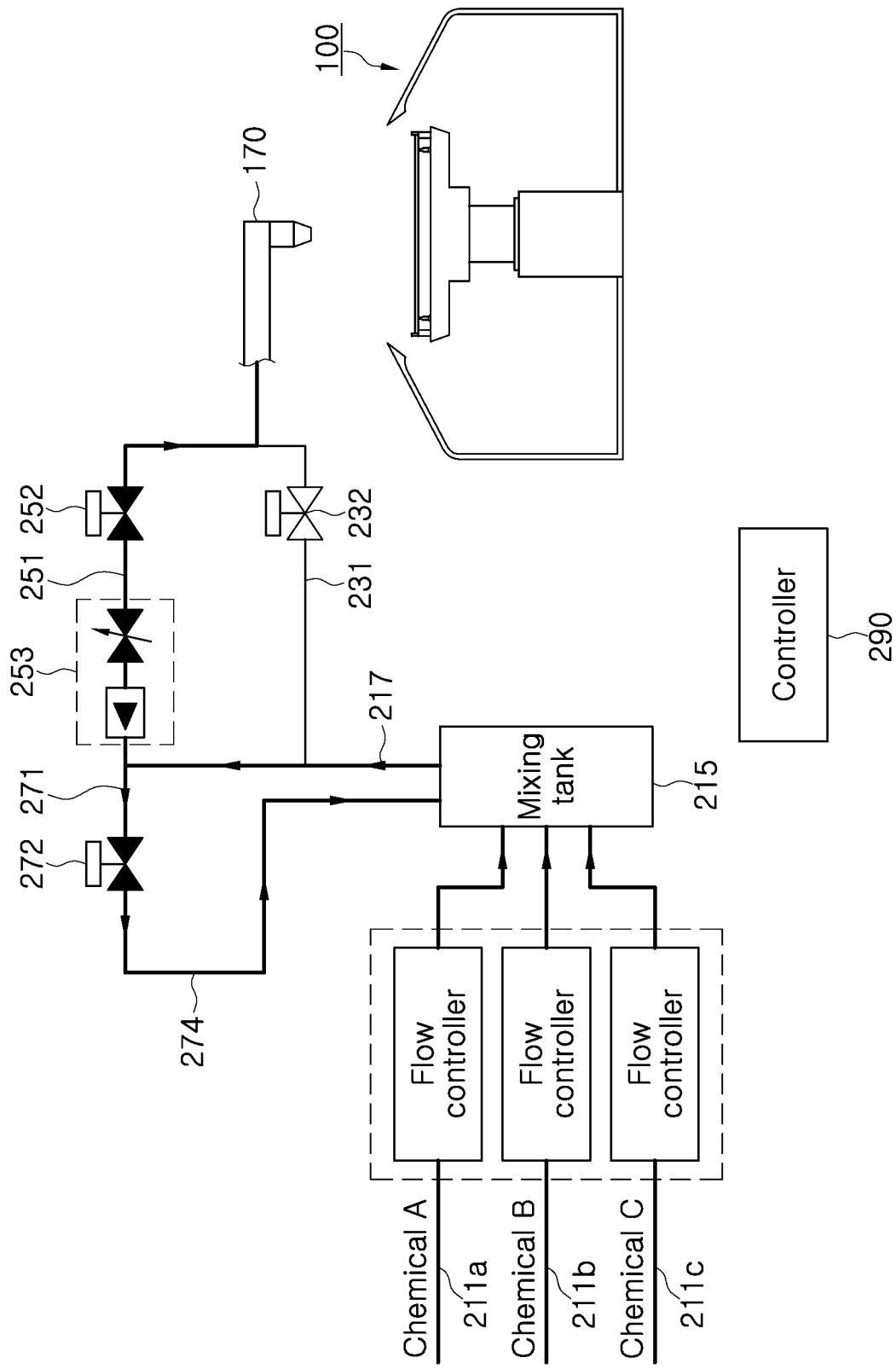
FIG. 16 is a view illustrating the second embodiment of processing the excess chemical liquid in the substrate processing apparatus according to the present disclosure.

The process of processing the excess chemical liquid may be variously modified in the present disclosure. In this regard, FIG. 15 is a flowchart illustrating a second embodiment of processing an excess chemical liquid in the chemical liquid supply method according to the present disclosure. FIG. 16 is a view illustrating the second embodiment of processing the excess chemical liquid in the substrate processing apparatus 100 according to the present disclosure.

A process of supplying a chemical liquid of a second flow rate prior to the process of processing the excess chemical liquid remains the same as or similar to that described with reference to FIGS. 12 and 14, so a detailed description thereof will be omitted.

The excess chemical liquid remaining in a second flow rate chemical liquid supply means 250 may be introduced into an excess chemical liquid line 271 of an excess chemical liquid processing means 270.

The excess chemical liquid processing means 270 may include a recovery line 274, and a controller 290 may selectively open an excess chemical liquid valve 272 disposed on the excess chemical liquid line 271 (S421) to recover the excess chemical liquid of the excess chemical liquid line 271 to the recovery line 274 (S423).

The recovery line 274 of the excess chemical liquid processing means 270 may be connected to a chemical liquid supply line 217 of a chemical liquid supply means 210, so that the recovered chemical liquid of the recovery line 274 may be supplied to the chemical liquid supply line 271 (S425). As the recovery line 274 may be connected to the chemical liquid supply line 217, the recovered chemical liquid of the recovery line 274 may be directly supplied to a first flow rate chemical liquid supply means 230 or the second flow rate chemical liquid supply means 250 through the chemical liquid supply line 217.

Furthermore, as illustrated in FIG. 16, the recovery line 274 of the excess chemical liquid processing means 270 may be connected to a mixing tank 215 of the chemical liquid supply means 210. The recovered chemical liquid recovered to the recovery line 274 may be supplied to the mixing tank 215 of the chemical liquid supply means 210 to be used again through the mixing tank 215.

Figure 17:
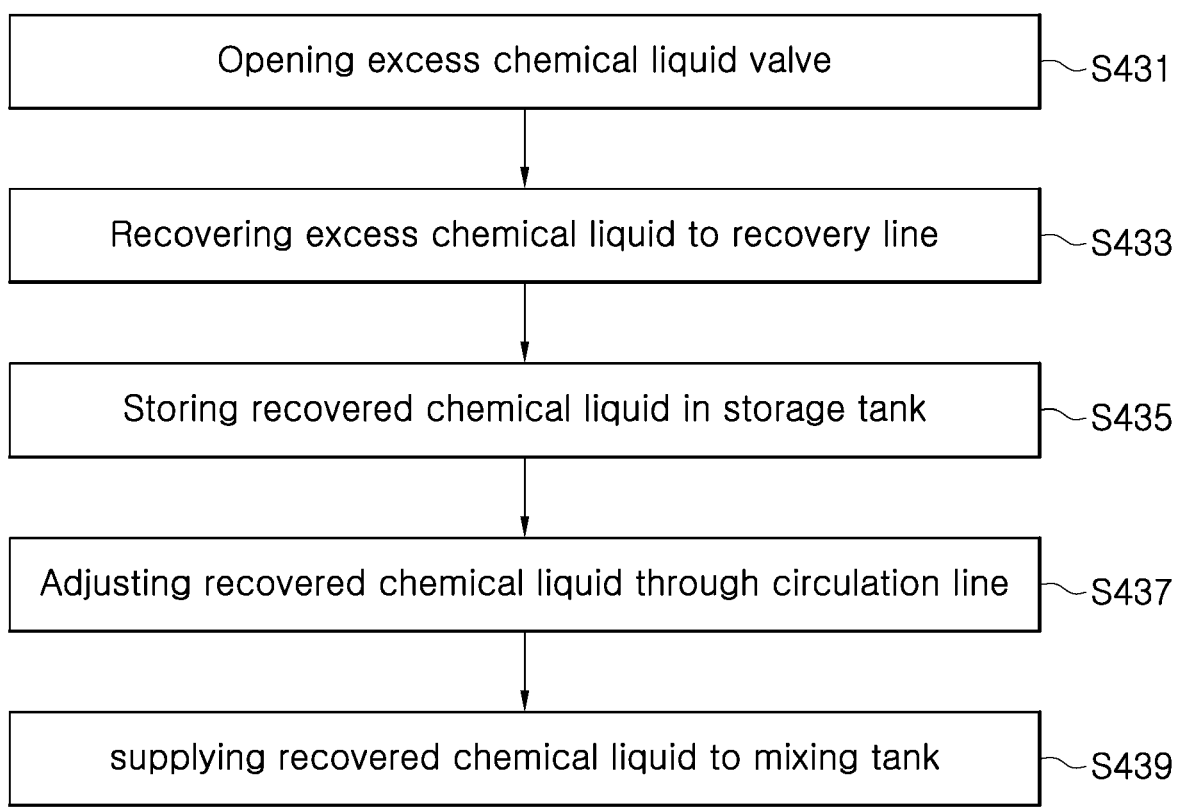
FIG. 17 is a flowchart illustrating a third embodiment of processing an excess chemical liquid in the chemical liquid supply method according to the present disclosure.
Figure 18:
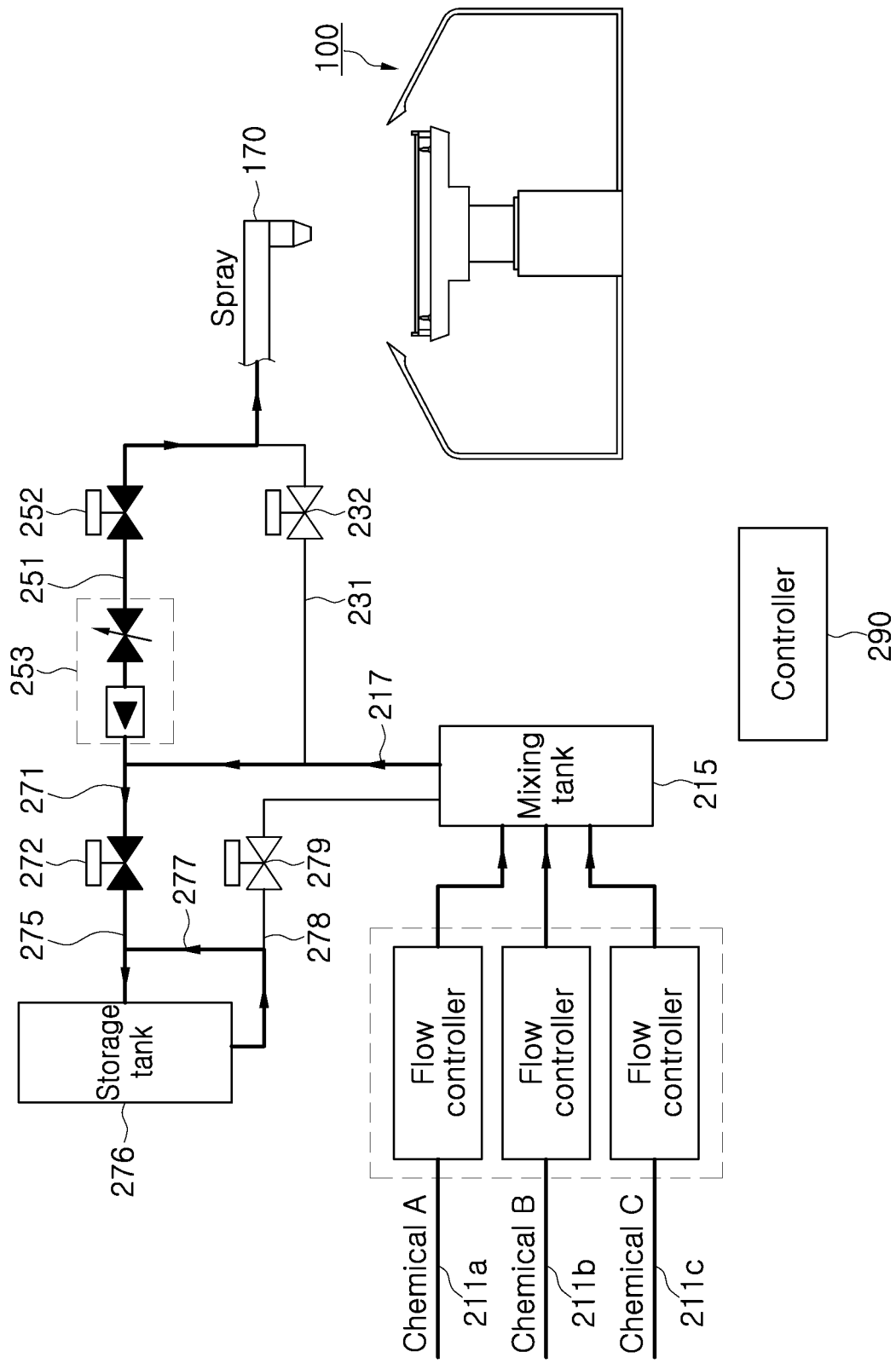
Figure 19:
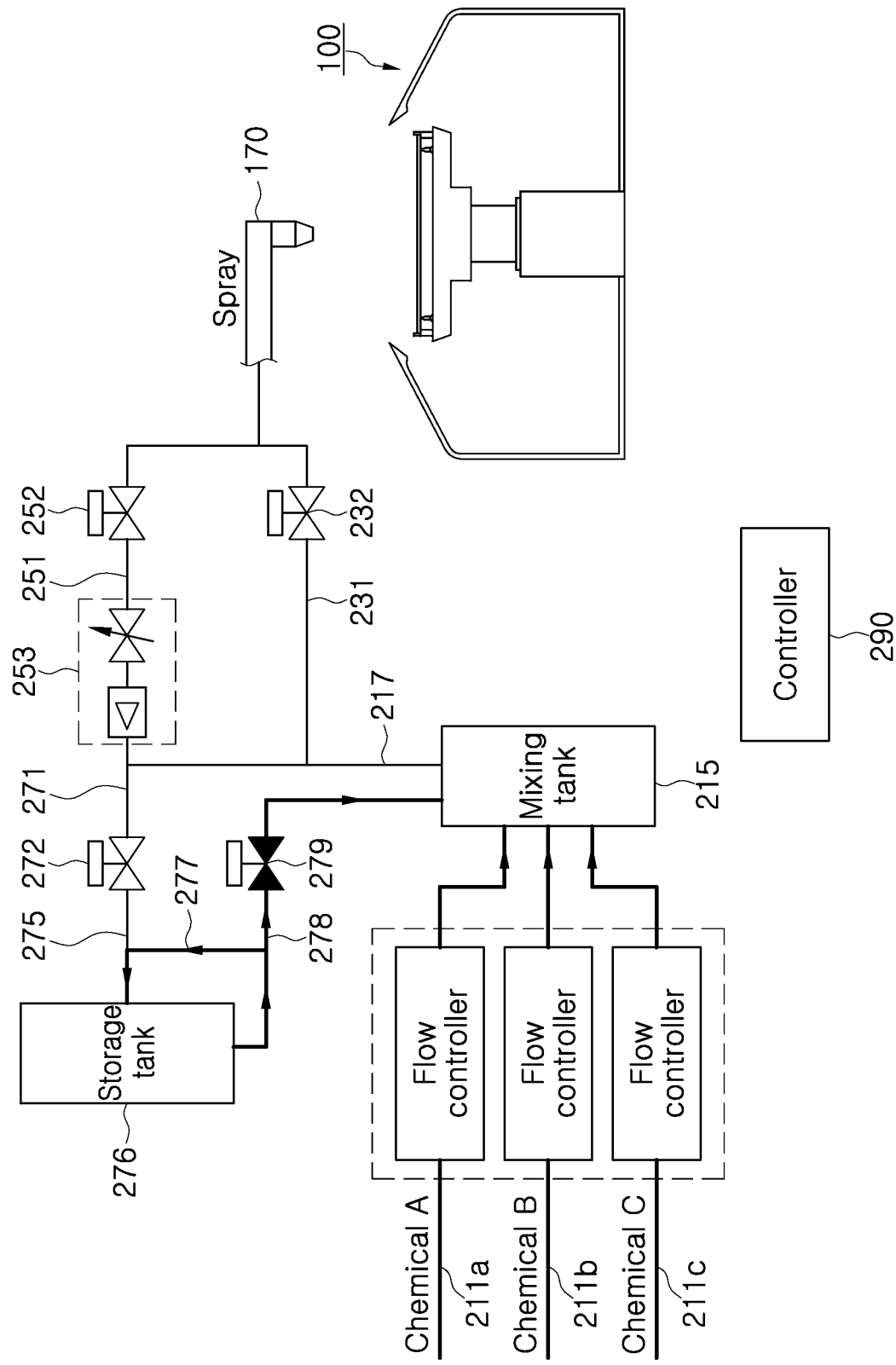

Another embodiment of a process of processing an excess chemical liquid will be described. FIG. 17 is a flowchart illustrating a third embodiment of processing an excess chemical liquid in the chemical liquid supply method according to the present disclosure. FIGS. 18 to 20 are views illustrating the third embodiment of processing the excess chemical liquid in the substrate processing apparatus 100 according to the present disclosure.

A process of supplying a chemical liquid of a second flow rate prior to the process of processing the excess chemical liquid remains the same as or similar to that described with reference to FIGS. 12 and 14, so a detailed description thereof will be omitted.

First, the process of recovering the excess chemical liquid will be described with reference to FIGS. 17 and 18.

The excess chemical liquid remaining in a second flow rate chemical liquid supply means 250 may be introduced into an excess chemical liquid line 271 of an excess chemical liquid processing means 270.

The excess chemical liquid processing means 270 may include a recovery line 274, and a controller 290 may selectively open an excess chemical liquid valve 272 disposed on the excess chemical liquid line 271 (S431) to recover the excess chemical liquid of the excess chemical liquid line 271 to the recovery line 274 (S433).

The excess chemical liquid processing means 270 may include a storage tank 276. The recovery line 274 may be connected to the storage tank 276, so that recovered chemical liquid recovered to the recovery line 274 may be supplied to the storage tank 276. The storage tank 276 may store the recovered chemical liquid temporarily or for a predetermined period of time (S435).

In the case of the recovered chemical liquid stored in the storage tank 276 for the predetermined period of time, it may not satisfy chemical liquid supply conditions such as chemical liquid's temperature and density required for a corresponding substrate processing process.

Therefore, the excess chemical processing means 270 may include a circulation line 277 for circulating the recovered chemical liquid stored in the storage tank 276. A heater (not illustrated), a pump (not illustrated), various measuring instruments (not illustrated), and the like may be disposed on the circulation line 277. Furthermore, a new chemical liquid may be supplied to the circulation line 277.

The controller 290 may adjust the recovered chemical liquid stored in the storage tank 276 to satisfy the chemical liquid supply conditions required for the recovered chemical liquid (S437) while circulating the recovered chemical liquid through the circulation line 277.

Next, a process of supplying the recovered chemical liquid will be described with reference to FIGS. 17, 19, and 20.

Without through the circulation line 277 of the excess chemical liquid processing means 270, the controller 290 may selectively control a recovery valve 279 to supply the recovered chemical liquid stored in the storage tank 276 to a mixing tank 215 through a recovered chemical liquid supply line 278 (S439) or to a chemical liquid supply line 217 so that the recovered chemical liquid is used again.

As described above, since the recovered chemical liquid stored in the storage tank 276 for the predetermined period of time may not satisfy the chemical liquid supply conditions such as chemical liquid's temperature and density required for the corresponding substrate processing process, the controller 290 may adjust the recovered chemical liquid while circulating the recovered chemical liquid through the circulation line 277 (S437).

When the recovered chemical liquid satisfies the chemical supply conditions or it is necessary to supply the recovered chemical liquid, the controller 290 may selectively open the recovery valve 279 to provide the recovered chemical liquid stored in the storage tank 276 through the recovered chemical liquid supply line 278 so that the recovered chemical liquid is used again.

As illustrated in FIG. 19, the recovered chemical liquid supply line 278 of the excess chemical liquid processing means 270 may be connected to the mixing tank 215 of a chemical liquid supply means 210, so that the recovered chemical liquid may be supplied to the mixing tank 215 (S439) to be used again through the mixing tank 215.

Alternatively, as illustrated in FIG. 20, the recovered chemical liquid supply line 278 of the excess chemical liquid processing means 270 may be connected to the chemical liquid supply line 217 of the chemical liquid supply means 210, so that the recovered chemical liquid of the recovery line 274 may be supplied to the chemical liquid supply line 271. The recovery line 274 may be connected to the chemical liquid supply line 217, so that the recovered chemical liquid of the recovery line 274 may be directly supplied to a first flow rate chemical liquid supply means 230 or the second flow rate chemical liquid supply means 250 through the chemical liquid supply line 217.

As described above, the present disclosure can supply chemical liquids of different flow rates through one chemical liquid supply unit according to a substrate processing process situation.

In particular, a chemical liquid is supplied at the same flow rate to each of the plurality of chemical liquid lines and the flow rate of the chemical liquid is adjusted through the flow control valve disposed on at least one chemical liquid line selected among the plurality of chemical liquid lines, so that the plurality of chemical liquid lines can supply chemical liquids at different flow rates.

Although exemplary embodiments of the present disclosure have been described for illustrative purposes, those skilled in the art will appreciate that various modifications, additions, and substitutions are possible, without departing from the scope and spirit of the present disclosure as disclosed in the appended claims. Therefore, exemplary embodiments of the present disclosure have not been described for limiting purposes, and the scope of the disclosure is not to be limited by the above embodiments. Therefore, the scope of the present disclosure should be determined on the basis of the descriptions in the appended claims, and all equivalents thereof should belong to the scope of the present disclosure.

What is claimed is:

1. A chemical liquid supply unit comprising:
   a chemical liquid supply source configured to supply a chemical liquid;
   a first flow rate chemical liquid supply line connected to the chemical liquid supply source and configured to receive the chemical liquid from the chemical liquid supply source and supply the chemical liquid at a first flow rate to a nozzle unit of a substrate processing apparatus;

a second flow rate chemical liquid supply line connected to the chemical liquid supply source and configured to:

receive the chemical liquid at the first flow rate from the chemical liquid supply source, and adjust a flow rate of the chemical liquid supplied to the nozzle unit of the substrate processing apparatus at a second flow rate, wherein an end of the first flow rate chemical liquid supply line and an end of the second flow rate chemical liquid supply line are connected with each other and the connected ends of the first flow rate chemical liquid supply line and the second flow rate chemical liquid supply line are connected to the nozzle unit;

an excess chemical liquid drain line configured to drain an excess chemical liquid except for the chemical liquid of the second flow rate from the supplied chemical liquid from the chemical liquid supply source according to adjustment of the flow rate of the chemical liquid through the second flow rate chemical liquid supply line; and a controller configured to:

selectively control chemical liquid supply of the first flow rate chemical liquid supply line and the second flow rate chemical liquid supply line so that one of the first flow rate chemical liquid supply line and the second flow rate chemical liquid supply line supplies the chemical liquid to the nozzle unit, and control the second flow rate chemical liquid supply line to adjust the flow rate of the chemical liquid to supply the chemical liquid at the second flow rate to the nozzle unit, wherein the second flow rate is different from the first flow rate.

2. The chemical liquid supply unit of claim 1, wherein the chemical liquid supply source comprises a chemical liquid supply line with a plurality of branch lines, wherein the first flow rate chemical liquid supply line comprises a first chemical liquid line connecting one of the plurality of branch lines of the chemical liquid supply line to the nozzle unit of the substrate processing apparatus, wherein the second flow rate chemical liquid supply line comprises:

a second chemical liquid line connecting another one of the plurality of branch lines of the chemical liquid supply line to the nozzle unit of the substrate processing apparatus; and a flow control valve disposed at the second chemical liquid line and configured to control a flow rate of the chemical liquid flowing through the second chemical liquid line, and wherein the controller controls the flow control valve to adjust the flow rate of the chemical liquid flowing through the second chemical liquid line to the second flow rate smaller than the first flow rate of the chemical liquid flowing through the first chemical liquid line.

3. The chemical liquid supply unit of claim 2, wherein the first flow rate chemical liquid supply line further comprises a first chemical liquid line valve disposed at the first chemical liquid line and configured to selectively supply the chemical liquid of the first chemical liquid line according to opening and closing operations of the first chemical liquid line valve, wherein the second flow rate chemical liquid supply line further comprises a second chemical liquid line valve disposed at the second chemical liquid line and configured to selectively supply the chemical liquid of the second chemical liquid line according to opening and closing operations of the second chemical liquid line valve to the nozzle unit of the substrate processing apparatus, and wherein the controller controls the first chemical liquid line valve and the second chemical liquid line valve to selectively supply one of the chemical liquid flowing through the first chemical liquid line at the first flow rate and the chemical liquid flowing through the second chemical liquid line at the second flow rate to the nozzle unit of the substrate processing apparatus.

4. The chemical liquid supply unit of claim 1, further comprising:

an excess chemical liquid valve connected to the excess chemical liquid drain line; and a drain line connected to the excess chemical liquid valve and selectively connected to the excess chemical liquid drain line to discharge the excess chemical liquid.

5. The chemical liquid supply unit of claim 1, wherein the chemical liquid supply source comprises:

a plurality of chemical liquid supply tanks configured to supply a plurality of chemical liquids different from each other in kind;

a plurality of flow controllers configured to control chemical liquid supply amounts of the plurality of chemical liquid supply tanks; and a mixing tank configured to mix and supply the plurality of chemical liquids.

6. The chemical liquid supply unit of claim 5, wherein the excess chemical liquid drain line comprises a recovery line connected to the mixing tank and configured to recover the excess chemical liquid and supply the excess chemical liquid to the mixing tank.

7. The chemical liquid supply unit of claim 5, wherein the excess chemical liquid drain line comprises:

a recovery line configured to recover the excess chemical liquid; and a storage tank connected to the recovery line and configured to store the recovered chemical liquid recovered through the recovery line.

8. The chemical liquid supply unit of claim 7, wherein the excess chemical liquid drain line further comprises a recovered chemical liquid supply line connecting the storage tank to the chemical liquid supply source and configured to supply the recovered chemical liquid stored in the storage tank to the chemical liquid supply source.

9. The chemical liquid supply unit of claim 7, wherein the excess chemical liquid drain line further comprises a recovered chemical liquid supply line connecting the storage tank to the mixing tank and configured to supply the recovered chemical liquid stored in the storage tank to the mixing tank.

10. The chemical liquid supply unit of claim 9, wherein the excess chemical liquid drain line further comprises a recovery valve disposed on the recovered chemical liquid supply line to selectively provide the recovered chemical liquid stored in the storage tank.

11. A chemical liquid supply unit comprising:

a chemical liquid supply source configured to supply a chemical liquid;

a chemical liquid supply line configured to receive the chemical liquid from the chemical liquid supply source and provide the chemical liquid through a plurality of branch lines;

a first chemical liquid line connected to one of the branch lines of the chemical liquid supply line and configured to supply the chemical liquid at a first flow rate to a nozzle unit of a substrate processing apparatus;

a first chemical liquid line valve disposed at the first chemical liquid line and configured to selectively supply the chemical liquid flowing through the first chemical liquid line at the first flow rate to the nozzle unit according to opening and closing operations;

a second chemical liquid line connected to another one of the branch lines of the chemical liquid supply line and configured to supply the chemical liquid at a second flow rate to the nozzle unit of the substrate processing apparatus;

a flow control valve disposed at the second chemical liquid line and configured to adjust the first flow rate of the chemical liquid supplied to the second chemical liquid line to the second flow rate smaller than the first flow rate;

a second chemical liquid line valve disposed on the second chemical liquid line and configured to selectively supply the chemical liquid flowing through the second chemical liquid line at the second flow rate to the nozzle unit according to opening and closing operations;

a recovery line configured to recovery an excess chemical liquid except for the chemical liquid of the second flow rate from the chemical liquid of the first flow rate supplied to the second chemical liquid line according to flow rate adjustment of the flow control valve; and a controller configured to control the flow control valve to adjust a flow rate of the second chemical liquid line to the second flow rate relatively smaller than the first flow rate, and control the first chemical liquid line valve and the second chemical liquid line valve to selectively supply one of the chemical liquid flowing through the first chemical liquid line at the first flow rate and the chemical liquid flowing through the second chemical liquid line at the second flow rate to the nozzle unit of the substrate processing apparatus.

* * * * *